(12) United States Patent
Xu et al.

(10) Patent No.: US 12,155,933 B2
(45) Date of Patent: Nov. 26, 2024

(54) ZOOM METHOD AND APPARATUS

(71) Applicant: HUAWEI TECHNOLOGIES CO., LTD., Guangdong (CN)

(72) Inventors: Xiaoyong Xu, Shenzhen (CN); Jia Hu, Dongguan (CN); Lei Lu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 29 days.

(21) Appl. No.: 18/160,345

(22) Filed: Jan. 27, 2023

(65) Prior Publication Data
US 2023/0171499 A1 Jun. 1, 2023

Related U.S. Application Data
(63) Continuation of application No. PCT/CN2021/090594, filed on Apr. 28, 2021.

(30) Foreign Application Priority Data

Jul. 30, 2020 (CN) .......................... 202010754835.1

(51) Int. Cl.
*H04N 23/69* (2023.01)
*G01R 33/07* (2006.01)
(Continued)

(52) U.S. Cl.
CPC ............ *H04N 23/69* (2023.01); *G01R 33/07* (2013.01); *H04N 23/55* (2023.01); *H04N 25/772* (2023.01); *H04N 25/778* (2023.01)

(58) Field of Classification Search
CPC ...... H04N 23/69; H04N 23/55; H04N 25/772; H04N 25/778; H04N 23/62; H04N 23/671;
(Continued)

(56) References Cited

U.S. PATENT DOCUMENTS 4,401,944 A * 8/1983 Narimatsu ............. G01R 33/09
324/252
9,407,799 B2 * 8/2016 Kasamatsu ............ H04N 23/67
(Continued)

FOREIGN PATENT DOCUMENTS

JP 2006058512 A 3/2006
JP 2017026911 A 2/2017
(Continued)

OTHER PUBLICATIONS

Office Action issued in JP2023-504473 with English translation, dated Feb. 6, 2024, 4 pages.
(Continued)

*Primary Examiner* — Abdelaaziz Tissire

(57) ABSTRACT

A zoom method and an apparatus to improve zoom accuracy of a camera module are disclosed. The zoom method includes: controlling, based on a target focal length, the lens to move in different subregions when the lens moves in an operation region, and determining position information of the lens based on a position detection relationship of a subregion in which the lens is currently located. The lens is controlled to move based on a position of the lens detected when the lens moves, so that the lens can more accurately stop at a position corresponding to the target focal length. This helps improve focusing accuracy of the camera module.

18 Claims, 10 Drawing Sheets

(51) Int. Cl.
*H04N 23/55* (2023.01)
*H04N 25/772* (2023.01)
*H04N 25/778* (2023.01)

(58) Field of Classification Search
CPC ........ H04N 23/57; H04N 23/67; G01R 33/07; G02B 7/102; G02B 7/28; G02B 15/14; G02B 7/04
See application file for complete search history.

(56) References Cited

U.S. PATENT DOCUMENTS

| | | | | |
|---|---|---|---|---|
| 2002/0025151 A1* | 2/2002 | Numako | ................ | G03B 17/00 |
| | | | | 396/87 |
| 2002/0118965 A1* | 8/2002 | Ogg | ..................... | G02B 7/04 |
| | | | | 396/79 |
| 2005/0196160 A1* | 9/2005 | Uenaka | .................. | H04N 23/68 |
| | | | | 396/55 |
| 2006/0256209 A1* | 11/2006 | Yoshida | ................ | H04N 23/67 |
| | | | | 348/E5.045 |
| 2007/0273364 A1* | 11/2007 | Takei | ..................... | G02B 7/102 |
| | | | | 324/207.2 |
| 2013/0120618 A1* | 5/2013 | Wang | ..................... | H04N 23/69 |
| | | | | 348/240.99 |

FOREIGN PATENT DOCUMENTS

| | | |
|---|---|---|
| JP | 2018188101 A | 11/2018 |
| WO | 2020022026 A1 | 1/2020 |

OTHER PUBLICATIONS

Office Action issued in IN202317011496, dated May 8, 2024, with English translation, 6 pages.

* cited by examiner

ZOOM METHOD AND APPARATUS

CROSS-REFERENCE TO RELATED APPLICATIONS

This application is a continuation of International Application No. PCT/CN2021/090594, filed on Apr. 28, 2021, which claims priority to Chinese Patent Application No. 202010754835.1, filed on Jul. 30, 2020. The disclosures of the aforementioned applications are hereby incorporated by reference in their entireties.

TECHNICAL FIELD

The present disclosure relates to the field of optical zoom technologies, and in particular, to a zoom method and an apparatus.

BACKGROUND

Electronic devices with a photographing function are currently increasingly popularized. A zoom function of a camera module in an electronic device is an important factor that affects photographing quality. If a clear image needs to be photographed, the camera module needs to have a good zoom capability.

To implement a better zoom function, more camera modules support optical zoom. For optical zoom, a focal length can be changed by moving a lens in a camera module, so that the resolution and quality of a subject image remains unchanged while the subject image is zoomed in, and the subject image is clear. However, during zooming, an existing camera module usually directly determines a fixed driving manner of a lens based on a target focal length, and then drives, in this fixed driving manner, the lens to stop at a position corresponding to the target focal length. However, this manner is usually interfered with by an environment, for example, vibration of the camera module. In this case, a position in which the lens finally stops may deviate far from a target position. As a result, focusing accuracy of the camera module is reduced, and an image photographed by the camera module cannot meet a user requirement.

In view of this, currently a zoom method is urgently needed to improve focusing accuracy of the camera module.

SUMMARY

The present disclosure provides a zoom method and an apparatus, to improve zoom accuracy of a camera module.

According to a first aspect, the present disclosure provides a zoom method. The method is applied to a camera module. The camera module includes a lens, a drive component, a position detection module, and a controller. The method is executed by the controller. The method includes: The controller obtains a target focal length, and when controlling, based on the target focal length, the drive component to drive the lens to move in an operation region, controls the lens to move in different subregions, and when the lens moves in each subregion, the controller may determine position information of the lens based on a position detection relationship of the subregion in which the lens is currently located. The operation region may include N subregions, where N is an integer greater than or equal to 2, and each subregion is smaller than the operation region. Each subregion corresponds to a position detection relationship, and the position detection relationship is used to define a capability of each digital signal output by the position detection module to represent a movement distance of the lens in the subregion.

In the foregoing design, a position of the lens is continuously detected when the lens moves, and the lens is controlled to move in different subregions based on the position of the lens, so that the lens can more accurately stop at a position corresponding to the target focal length. This helps improve focusing accuracy of the camera module. Further, the operation region of the lens is partitioned into at least two subregions, so that each subregion may be smaller than the operation region. In this way, if ranges of digital signals output by the position detection module are consistent, a position movement amount (namely, the movement distance) that is of the lens and that is represented by each digital signal output by the position detection module in each subregion is less than a position movement amount in the entire operation region, so that the controller can detect a position change of the lens at a finer granularity. This improves position detection accuracy of the lens. The lens is controlled to move based on a more accurate position. This can further improve zoom accuracy of the camera module.

In an optional design, the N subregions may include a first subregion and a second subregion. The first subregion and the second subregion are adjacent and have an overlapping region. When the controller controls the drive component to drive the lens to move from the first subregion to the second subregion, before the lens moves to a preset position in the overlapping region, the controller determines the first subregion as the subregion in which the lens is currently located, and after the lens moves to the preset position in the overlapping region, the controller determines the second subregion as the subregion in which the lens is currently located. In this design, the preset position is equivalent to a switching point between two subregions, and the controller switches to a position detection relationship of another subregion at the switching point to detect the position of the lens. In this manner, position detection of the lens between the two subregions does not stop. This helps improve continuity of controlling movement of the lens.

In an optional design, the preset position may be an end position of the overlapping region, and the lens moves out of the overlapping region at the end position. This design is applicable to a scenario in which the lens moves back and forth near the overlapping region. Switching the position detection relationship usually causes an electrical signal jump, and is not conducive to zoom stability. Therefore, the position detection relationship is switched only when the lens actually moves out of the overlapping region, so that a quantity of times of switching the position detection relationship can be reduced, a quantity of times of electrical signal jumps can be reduced, and zoom stability can be improved.

In an optional design, that the controller controls, based on the target focal length, the lens to move in different subregions includes: The controller first determines target position information of the lens based on the target focal length, when first position information of a current position of the lens does not match the target position information, the controller inputs a first electrical signal to the drive component based on the first position information and the target position information, so that the drive component drives the lens to move, and determines, based on a position detection relationship of a subregion in which the lens is located after the lens moves, second position information of the lens after the lens moves, and when the second position information does not match the target position information, the controller inputs a second electrical signal to the drive component based on the second position information and the target position information, so that the drive component drives the lens to continue to move, and when the second position information matches the target position information, the drive component stops driving the lens to move. In this design, the current position of the lens is continuously detected when the lens moves, and an electrical signal of the drive component is adjusted based on the position. This helps drive the lens to more accurately stop at a target position, and improves focusing accuracy of the camera module.

In an optional design, the position detection module may include a Hall effect sensor module and an analog-to-digital conversion module. The position detection relationship of each subregion includes a configuration parameter of the analog-to-digital conversion module corresponding to the subregion, and a correspondence between a digital signal output by the analog-to-digital conversion module corresponding to the subregion and the position information of the lens. In this case, that the controller determines, based on a position detection relationship of a subregion in which the lens is located after the lens moves, second position information of the lens after the lens moves includes: The controller first determines, based on position indication information that is of the lens and that is detected by the Hall effect sensor module and a preset correspondence between the position indication information and the subregion, the target subregion in which the lens is located after the lens moves, processes the position indication information based on a first configuration parameter of an analog-to-digital conversion module corresponding to the target subregion by using the analog-to-digital conversion module, to output a first digital signal, and determines, based on the correspondence between the digital signal output by the analog-to-digital conversion module corresponding to the target subregion and the position information of the lens, the second position information corresponding to the first digital signal. The position indication information indicates position information after the lens moves.

In this design, the preset correspondence between the position indication information and the subregion, the configuration parameter corresponding to each subregion, and the correspondence between the digital signal output by the analog-to-digital conversion module corresponding to each subregion and the position information of the lens are set, so that the controller can first directly query, based on the position indication information corresponding to the current position of the lens, the preset correspondence between the position indication information and the subregion to determine a subregion in which the lens is located, and then query, with support of a configuration parameter corresponding to the subregion in which the lens is located, the correspondence between the digital signal output by the analog-to-digital conversion module corresponding to the subregion in which the lens is located and the position information of the lens, to determine the position information of the lens in the subregion in which the lens is located. A manner of querying the correspondence helps more quickly detect the position of the lens, and improves focusing efficiency of the camera module.

In an optional design, the drive component may include a motor. The Hall effect sensor module may include a Hall magnet and a Hall coil. The Hall magnet is fastened to the lens. In this case, the position indication information may be an electrical signal output by the Hall coil. The controller drives, by using the drive component, the lens to move. Specifically, the controller may drive, by using the motor, the lens and the Hall magnet to move. When the Hall magnet moves, the Hall coil outputs a third electrical signal to the analog-to-digital conversion module. In this way, the controller may determine, based on a preset correspondence between the electrical signal output by the Hall coil and the subregion in which the lens is located, a target subregion corresponding to the third electrical signal. In this design, the preset correspondence between the electrical signal output by the Hall coil and the subregion in which the lens is located is pre-stored, so that the controller can directly find, based on the correspondence, the target subregion in which the lens is located. This helps more quickly detect the current position of the lens. In addition, the Hall effect sensor has a simple structure and a small size, and can quickly respond to a position change. Therefore, position detection is performed by using the Hall effect sensor, so that position detection efficiency can be improved while costs are reduced and a size of the camera module is reduced.

In a possible design, the analog-to-digital conversion module may include a first-stage amplifier, a second-stage amplifier, a bias tee, and an analog-to-digital converter. An input end of the first-stage amplifier is connected to the Hall coil. An output end of the first-stage amplifier is connected to an input end of the second-stage amplifier. An output end of the second-stage amplifier is connected to an input end of the bias tee. An output end of the bias tee is connected to an input end of the analog-to-digital converter. In this case, the first configuration parameter may include an amplification coefficient of the first-stage amplifier, an amplification coefficient of the second-stage amplifier, and a bias coefficient of the bias tee. When the controller processes the position indication information based on the first configuration parameter of the analog-to-digital conversion module corresponding to the target subregion by using the analog-to-digital conversion module, to output the first digital signal, the controller may specifically process the third electrical signal by using the first-stage amplifier, the second-stage amplifier, and the bias tee, and output the first digital signal by using the analog-to-digital converter. In this design, the controller may perform, by using the analog-to-digital conversion module, amplification adjustment and/or bias adjustment on the third electrical signal output by the Hall coil. Such adjustment can enable the third electrical signal to be in a proper range, to facilitate position detection and movement driving during focusing. In addition, the controller may perform adjustment each time based on a configuration parameter corresponding to a subregion in which the lens is currently located. Therefore, even if there is an overlapping region between the subregions, the adjusted digital signal can accurately match the subregion in which the lens is currently located. This helps improve positioning accuracy of the lens.

In an optional design, the N subregions may include the first subregion and the second subregion. The first subregion and the second subregion are adjacent and have an overlapping region. In this case, that the controller determines, based on position indication information that is of the lens and that is detected by the Hall effect sensor module and a preset correspondence between the position indication information and the subregion, a subregion in which the lens is currently located includes: When the position indication information that is of the lens and that is detected by the Hall effect sensor module matches the position indication information corresponding to the first subregion, the controller may determine, as the first subregion, a target subregion in which the lens is located after the lens moves, where the position indication information corresponding to the first subregion includes position indication information that is of the lens and that is detected by the Hall effect sensor module when the lens is located in any position between a first endpoint of the first subregion and a preset position, and the first endpoint is not in the overlapping region; and when the position indication information that is of the lens and that is detected by the Hall effect sensor module matches position indication information corresponding to the second subregion, the controller may determine, as the second subregion, the target subregion in which the lens is located after the lens moves, where the position indication information corresponding to the second subregion includes position indication information that is of the lens and that is detected by the Hall effect sensor module when the lens is located at any position between the preset position and a second endpoint of the second subregion, and the second endpoint is not in the overlapping region. The preset position may be a position in the overlapping region. In this design, a correspondence between an endpoint position of each subregion, the preset position, and electrical signals output by the Hall coil at these positions is pre-stored. Even if the lens is located in an overlapping region of two subregions, and the electrical signal output by the Hall coil corresponds to two positions in the two subregions, the controller can still use a position in the subregion in which the lens is currently located as the current position of the lens. This helps improve position detection accuracy of the lens in the overlapping region.

In an optional design, the N subregions may include a third subregion and a fourth subregion. The third subregion includes a third endpoint and a fourth endpoint. The fourth subregion includes a fifth endpoint and a sixth endpoint. In this case, before determining the target position information of the lens based on the target focal length, the controller further controls the lens to move in the third subregion and the fourth subregion, when the lens is located at the third endpoint, processes a fourth electrical signal by using the analog-to-digital conversion module based on a second configuration parameter, to output a second digital signal, when the lens is located at the fourth endpoint, processes a fifth electrical signal by using the analog-to-digital conversion module based on a second configuration parameter, to output a third digital signal, when the lens is located at the fifth endpoint, processes a sixth electrical signal by using the analog-to-digital conversion module based on a third configuration parameter, to output a fourth digital signal, and when the lens is located at the sixth endpoint, processes a seventh electrical signal by using the analog-to-digital conversion module based on a third configuration parameter, to output a fifth digital signal. A difference between the second digital signal and the third digital signal is a first difference. A difference between the fourth digital signal and the fifth digital signal is a second difference. In this case, an absolute value of the first difference and an absolute value of the second difference are not less than a preset digital signal range difference.

In this design, before focusing, the controller can first check each subregion based on the preset digital signal range difference, where the preset digital signal range difference may be a preset position movement amount corresponding to required position detection precision. In this case, a position movement amount that is of the lens and that is represented by each digital electrical signal output by the analog-to-digital conversion module in a subregion is directly proportional to a ratio of a length between two ends of the subregion to a difference between digital electrical signals output by the analog-to-digital conversion module at the two ends of the subregion. Therefore, the difference between the digital electrical signals output by the analog-to-digital conversion module at the two ends of each subregion is adjusted to be not less than the preset digital signal range difference, so that the position movement amount that is of the lens and that is represented by each digital electrical signal output by the analog-to-digital conversion module in each subregion may not be greater than the preset position movement amount. In this manner, position detection precision of the lens can be greater than the required position detection precision. A larger preset digital signal range difference indicates higher position detection precision of the lens.

In an optional design, a correspondence between a digital signal output by the analog-to-digital conversion module corresponding to the third subregion and the position information of the lens includes the following features: The second digital signal corresponds to position information at the third endpoint, and the third digital signal corresponds to position information at the fourth endpoint. Correspondingly, a correspondence between a digital signal output by the analog-to-digital conversion module corresponding to the fourth subregion and the position information of the lens includes the following features: The fourth digital signal corresponds to position information at the fifth endpoint, and the fifth digital signal corresponds to position information at the sixth endpoint. In this design, the controller can determine a correspondence between any position in each subregion and a digital signal based on positions of two endpoints of each subregion and digital signals corresponding to the two endpoints. In this way, the controller can query the correspondence based on the digital signal corresponding to the current position of the lens during focusing, to accurately determine the position of the lens in the current subregion.

In an optional design, a union set of the N subregions is not smaller than the operation region of the lens. In this way, the N subregions can cover the entire operation region, so that the controller can accurately detect a position to which the lens moves in the operation region.

According to a second aspect, the present disclosure provides a camera module. The camera module includes a lens, a drive component, a position detection module, a controller, and a memory. The controller is separately connected to the drive component and the position detection module. The memory stores one or more computer programs, and the one or more computer programs include instructions. When the instructions are invoked and executed by the controller, the controller performs the following method: obtaining a target focal length, sending control information to the drive component based on the target focal length, so that the drive component drives, under control of the control information, the lens to move in an operation region, where the operation region includes N subregions, N is an integer greater than or equal to 2, and each subregion is smaller than an operation region. Each subregion corresponds to a position detection relationship, and the position detection relationship is used to define a capability of each digital signal output by the position detection module to represent a movement distance of the lens in the subregion. In this case, the controller may be further configured to: when the lens moves in each subregion, determine position information of the lens based on a position detection relationship of a subregion in which the lens is currently located.

In an optional design, the N subregions may include a first subregion and a second subregion. The first subregion and the second subregion are adjacent and have an overlapping region. In this case, the drive component may drive, under control of the control information, to move from the first subregion to the second subregion. The controller may determine, before the lens moves to a preset position in the overlapping region, the first subregion as the subregion in which the lens is currently located, and after the lens moves to the preset position in the overlapping region, determine the second subregion as the subregion in which the lens is currently located.

In an optional design, the preset position is an end position of the overlapping region, and the lens moves out of the overlapping region at the end position.

In an optional design, the controller may determine target position information of the lens based on the target focal length. When first position information of a current position of the lens does not match the target position information, the controller inputs a first electrical signal to the drive component based on the first position information and the target position information, so that the drive component drives, based on the first electrical signal, the lens to move. The controller may further determine, based on a position detection relationship of a subregion in which the lens is located after the lens moves, second position information of the lens after the lens moves. When the second position information does not match the target position information, the controller inputs a second electrical signal to the drive component based on the second position information and the target position information, so that the drive component drives, based on the second electrical signal, the lens to continue to move, and when the second position information matches the target position information, the controller sends drive stop information to the drive component, so that the drive component stops driving the lens to move.

In an optional design, the position detection module may include a Hall effect sensor module and an analog-to-digital conversion module. The controller is separately connected to the Hall effect sensor module and the analog-to-digital conversion module. In this design, the position detection relationship of each subregion includes a configuration parameter of the analog-to-digital conversion module corresponding to the subregion, and a correspondence between a digital signal output by the analog-to-digital conversion module corresponding to the subregion and the position information of the lens. In this case, when the drive component drives, based on the first electrical signal, the lens to move, the controller may further obtain position indication information that is of the lens and that is detected by the Hall effect sensor module, determine, based on the position indication information and a preset correspondence between the position indication information and a subregion, a target subregion in which the lens is located after the lens moves, send a first configuration parameter of an analog-to-digital conversion module corresponding to the target subregion to the analog-to-digital conversion module, and processes the position indication information based on the first configuration parameter of the analog-to-digital conversion module corresponding to the target subregion by using the analog-digital conversion module, to output a first digital signal. The controller may further obtain the first digital signal, and determine, based on the correspondence between the digital signal output by the analog-to-digital conversion module corresponding to the target subregion and the position information of the lens, the second position information corresponding to the first digital signal. The position indication information indicates position information after the lens moves.

In an optional design, the drive component may include a motor. The Hall effect sensor module may include a Hall magnet and a Hall coil. The Hall magnet is fastened to the lens. In this case, the drive component may drive, by using the motor, the lens and the Hall magnet to move. When the Hall magnet moves, the Hall coil may output a third electrical signal to the analog-to-digital conversion module, so that the analog-to-digital conversion module processes the third electrical signal based on the first configuration parameter of the analog-to-digital conversion module corresponding to the target subregion, to output the first digital signal. The controller may further obtain the third electrical signal, and determine, based on a preset correspondence between the electrical signal output by the Hall coil and the subregion in which the lens is located, a target subregion corresponding to the third electrical signal.

In a possible design, the analog-to-digital conversion module may include a first-stage amplifier, a second-stage amplifier, a bias tee, and an analog-to-digital converter. An input end of the first-stage amplifier is connected to the Hall coil. An output end of the first-stage amplifier is connected to an input end of the second-stage amplifier. An output end of the second-stage amplifier is connected to an input end of the bias tee. An output end of the bias tee is connected to an input end of the analog-to-digital converter. In this case, the first configuration parameter may include an amplification coefficient of the first-stage amplifier, an amplification coefficient of the second-stage amplifier, and a bias coefficient of the bias tee. The analog-to-digital conversion module may process the third electrical signal by using the first-stage amplifier, the second-stage amplifier, and the bias tee, and output the first digital signal.

In an optional design, the N subregions may include the first subregion and the second subregion. The first subregion and the second subregion are adjacent and have an overlapping region. In this case, the controller may further obtain the position indication information that is of the lens and that is detected by the Hall effect sensor module: when the position indication information matches position indication information corresponding to the first subregion, determine the target subregion as the first subregion, where the position indication information corresponding to the first subregion includes position indication information that is of the lens and that is detected by the Hall effect sensor module when the lens is located at any position between a first endpoint of the first subregion and a preset position, and the first endpoint is not in the overlapping region; and when the position indication information matches position indication information corresponding to the second subregion, determine the target subregion as the second subregion, where the position indication information corresponding to the second subregion includes position indication information that is of the lens and that is detected by the Hall effect sensor module when the lens is located at any position between the preset position and a second endpoint of the second subregion, and the second endpoint is not in the overlapping region. The preset position is a position in the overlapping region.

In an optional design, the N subregions may include a third subregion and a fourth subregion. The third subregion includes a third endpoint and a fourth endpoint. The fourth subregion includes a fifth endpoint and a sixth endpoint. Before determining the target position information of the lens based on the target focal length, the controller may further send calibration control information to the drive component, so that the drive component drives, under control of the calibration control information, the lens to move between the third subregion and the fourth subregion. When the lens moves in the third subregion, the controller may input a second configuration parameter to the analog-to-digital conversion module, when the lens is located at the third endpoint, processes a fourth electrical signal by using the analog-to-digital conversion module based on the second configuration parameter, to output a second digital signal, and when the lens is located at the fourth endpoint, processes a fifth electrical signal by using the analog-to-digital conversion module based on the second configuration parameter, to output a third digital signal. The controller is further configured to: when the lens moves in the fourth subregion, input a third configuration parameter to the analog-to-digital conversion module, when the lens is located at the fifth endpoint, process a sixth electrical signal by using the analog-to-digital conversion module based on the third configuration parameter, to output a fourth digital signal, and when the lens is located at the sixth endpoint, process a seventh electrical signal by using the analog-to-digital conversion module based on the third configuration parameter, to output a fifth digital signal. An absolute value of a first difference and an absolute value of a second difference are not less than a preset digital signal range difference, the first difference is a difference between the second digital signal and the third digital signal, and the second difference is a difference between the fourth digital signal and the fifth digital signal.

In an optional design, the controller may further establish a correspondence between a digital signal output by the analog-to-digital conversion module corresponding to the third subregion and the position information of the lens, and a correspondence between a digital signal output by the analog-to-digital conversion module corresponding to the fourth subregion and the position information of the lens. The correspondence between the digital signal output by the analog-to-digital conversion module corresponding to the third subregion and the position information of the lens includes the following features: The second digital signal corresponds to position information at the third endpoint, and the third digital signal corresponds to position information at the fourth endpoint. The correspondence between the digital signal output by the analog-to-digital conversion module corresponding to the fourth subregion and the position information of the lens includes the following features: The fourth digital signal corresponds to position information at the fifth endpoint, and the fifth digital signal corresponds to position information at the sixth endpoint.

In an optional design, a union set of the N subregions is not smaller than the operation region of the lens.

According to a third aspect, the present disclosure provides an electronic device. The electronic device includes a processor and the camera module according to any one of the second aspect. The processor is configured to control the camera module. For example, the processor may generate a processing instruction in response to a photographing operation of a user, and send the processing instruction to the camera module, so that the camera module performs various operations (for example, moving a lens to perform focusing, and outputting data of a photosensitive element to the processor).

According to a fourth aspect, the present disclosure provides a controller. The controller is located in a camera module. The camera module further includes a lens, a drive component, and a position detection module. The controller includes an obtaining unit, a control unit, and a detection unit.

The obtaining unit is configured to obtain a target focal length.

The control unit is configured to control, based on the target focal length, the lens to move in different subregions. An operation region includes N subregions. N is an integer greater than or equal to 2. Each subregion is smaller than the operation region. Each subregion corresponds to a position detection relationship. The position detection relationship is used to define a capability of each digital signal output by the position detection module to represent a movement distance of the lens in the subregion.

The detection unit is configured to: when the lens moves in each subregion, determine position information of the lens based on a position detection relationship of a subregion in which the lens is currently located.

In an optional implementation, the N subregions may include a first subregion and a second subregion. The first subregion and the second subregion are adjacent and have an overlapping region. The control unit is further configured to: before the lens moves to a preset position in the overlapping region, determine the first subregion as the subregion in which the lens is currently located; and after the lens moves to the preset position in the overlapping region, determine the second subregion as the subregion in which the lens is currently located.

In an optional implementation, the preset position is an end position of the overlapping region, and the lens moves out of the overlapping region at the end position.

In an optional implementation, the control unit is specifically configured to: determine target position information of the lens based on the target focal length, and when first position information of a current position of the lens does not match the target position information, input a first electrical signal to the drive component based on the first position information and the target position information, so that the drive component drives the lens to move. The detection unit is specifically configured to determine, based on a position detection relationship of a subregion in which the lens is located after the lens moves, second position information of the lens after the lens moves. The control unit is further configured to: when the second position information does not match the target position information, input a second electrical signal to the drive component based on the second position information and the target position information, so that the drive component drives the lens to continue to move, and when the second position information matches the target position information, the drive component stops driving the lens to move.

In an optional implementation, the position detection module may include a Hall effect sensor module and an analog-to-digital conversion module. The position detection relationship of each subregion includes a configuration parameter of the analog-to-digital conversion module corresponding to the subregion, and a correspondence between a digital signal output by the analog-to-digital conversion module corresponding to the subregion and the position information of the lens. In this case, the detection unit is specifically configured to: first determine, based on position indication information that is of the lens and that is detected by the Hall effect sensor module and a preset correspondence between the position indication information and the subregion, a target subregion in which the lens is located after the lens moves, process the position indication information based on a first configuration parameter of the analog-to-digital conversion module corresponding to the target subregion by using the analog-to-digital conversion module, to output a first digital signal, and determine, based on a correspondence between the digital signal output by the analog-to-digital conversion module corresponding to the target subregion and the position information of the lens, the second position information corresponding to the first digital signal. The position indication information indicates position information after the lens moves.

In an optional implementation, the drive component may include a motor. The Hall effect sensor module may include a Hall magnet and a Hall coil. The Hall magnet is fastened to the lens. The position indication information may be an electrical signal output by the Hall coil. In this case, the control unit is specifically configured to drive, by using the motor, the lens and the Hall magnet to move. The detection unit is further configured to: when the Hall magnet moves, output a third electrical signal to the analog-to-digital conversion module by using the Hall coil, and determine, based on a preset correspondence between the electrical signal output by the Hall coil and the subregion in which the lens is located, a target subregion corresponding to the third electrical signal.

In a possible implementation, the analog-to-digital conversion module may include a first-stage amplifier, a second-stage amplifier, a bias tee, and an analog-to-digital converter. An input end of the first-stage amplifier is connected to the Hall coil. An output end of the first-stage amplifier is connected to an input end of the second-stage amplifier. An output end of the second-stage amplifier is connected to an input end of the bias tee. An output end of the bias tee is connected to an input end of the analog-to-digital converter. The first configuration parameter includes an amplification coefficient of the first-stage amplifier, an amplification coefficient of the second-stage amplifier, and a bias coefficient of the bias tee. In this case, the detection unit is specifically configured to process the third electrical signal by using the first-stage amplifier, the second-stage amplifier, and the bias tee, and output the first digital signal by using the analog-to-digital converter.

In an optional implementation, the N subregions may include the first subregion and the second subregion. The first subregion and the second subregion are adjacent and have an overlapping region. The detection unit is specifically configured to: when the position indication information that is of the lens and that is detected by the Hall effect sensor module matches position indication information corresponding to the first subregion, determine the target subregion as the first subregion, where the position indication information corresponding to the first subregion includes the position indication information that is of the lens and that is detected by the Hall effect sensor module when the lens is located in any position between a first endpoint of the first subregion and a preset position, and the first endpoint is not in the overlapping region; and when the position indication information that is of the lens and that is detected by the Hall effect sensor module matches position indication information corresponding to the second subregion, determine the target subregion as the second subregion, where the position indication information corresponding to the second subregion includes position indication information that is of the lens and that is detected by the Hall effect sensor module when the lens is located at any position between the preset position and a second endpoint of the second subregion, and the second endpoint is not in the overlapping region. The preset position is a position in the overlapping region.

In an optional implementation, the N subregions may include a third subregion and a fourth subregion. The third subregion includes a third endpoint and a fourth endpoint. The fourth subregion includes a fifth endpoint and a sixth endpoint. Before the detection unit determines the target position information of the lens based on the target focal length, the control unit is further configured to control the drive component to drive the lens to move between the third subregion and the fourth subregion. The detection unit is further configured to: when the lens is located at the third endpoint, process a fourth electrical signal by using the analog-to-digital conversion module based on a second configuration parameter, to output a second digital signal, when the lens is located at the fourth endpoint, process a fifth electrical signal by using the analog-to-digital conversion module based on a second configuration parameter, to output a third digital signal, when the lens is located at the fifth endpoint, process a sixth electrical signal by using the analog-to-digital conversion module based on a third configuration parameter, to output a fourth digital signal, and when the lens is located at the sixth endpoint, process a seventh electrical signal by using the analog-to-digital conversion module based on a third configuration parameter, to output a fifth digital signal. A difference between the second digital signal and the third digital signal is a first difference. A difference between the fourth digital signal and the fifth digital signal is a second difference. An absolute value of the first difference and an absolute value of the second difference are not less than a preset digital signal range difference.

In an optional implementation, a correspondence between a digital signal output by the analog-to-digital conversion module corresponding to the third subregion and the position information of the lens includes the following features: The second digital signal corresponds to position information at the third endpoint, and the third digital signal corresponds to position information at the fourth endpoint. Correspondingly, a correspondence between a digital signal output by the analog-to-digital conversion module corresponding to the fourth subregion and the position information of the lens includes the following features: The fourth digital signal corresponds to position information at the fifth endpoint, and the fifth digital signal corresponds to position information at the sixth endpoint.

In an optional implementation, a union set of the N subregions is not smaller than the operation region of the lens.

According to a fifth aspect, the present disclosure further provides a computer-readable storage medium. The computer-readable storage medium stores computer-executable instructions. When the computer-executable instructions are invoked by a computer, the computer is enabled to perform the method in any one of the foregoing possible implementations of the foregoing aspects.

According to a sixth aspect, the present disclosure further provides a computer program product. When the computer program product runs on a terminal, an electronic device is enabled to perform the method in any one of the foregoing possible implementations of the foregoing aspects.

DESCRIPTION OF EMBODIMENTS

Embodiments disclosed in the present disclosure may be applied to an electronic device having a photographing function. The electronic device in embodiments of the present disclosure may be an apparatus having only an image shooting function, for example, a camera. Alternatively, the electronic device in embodiments of the present disclosure may be an apparatus having an image shooting function and further having another function, for example, may be a portable electronic device including a function such as a personal digital assistant and/or a music player, such as a mobile phone, a tablet computer, a wearable device (such as a smartwatch) having a wireless communication function, or a vehicle-mounted device. An example embodiment of the portable electronic device includes but is not limited to a portable electronic device using iOS®, Android®, Microsoft®, or another operating system. The portable electronic device may alternatively be, for example, a laptop having a photographing apparatus (for example, a camera). It should be further understood that in some other embodiments of the present disclosure, the electronic device may alternatively be a desktop computer with a photographing apparatus (for example, a camera).

Figure 1A:
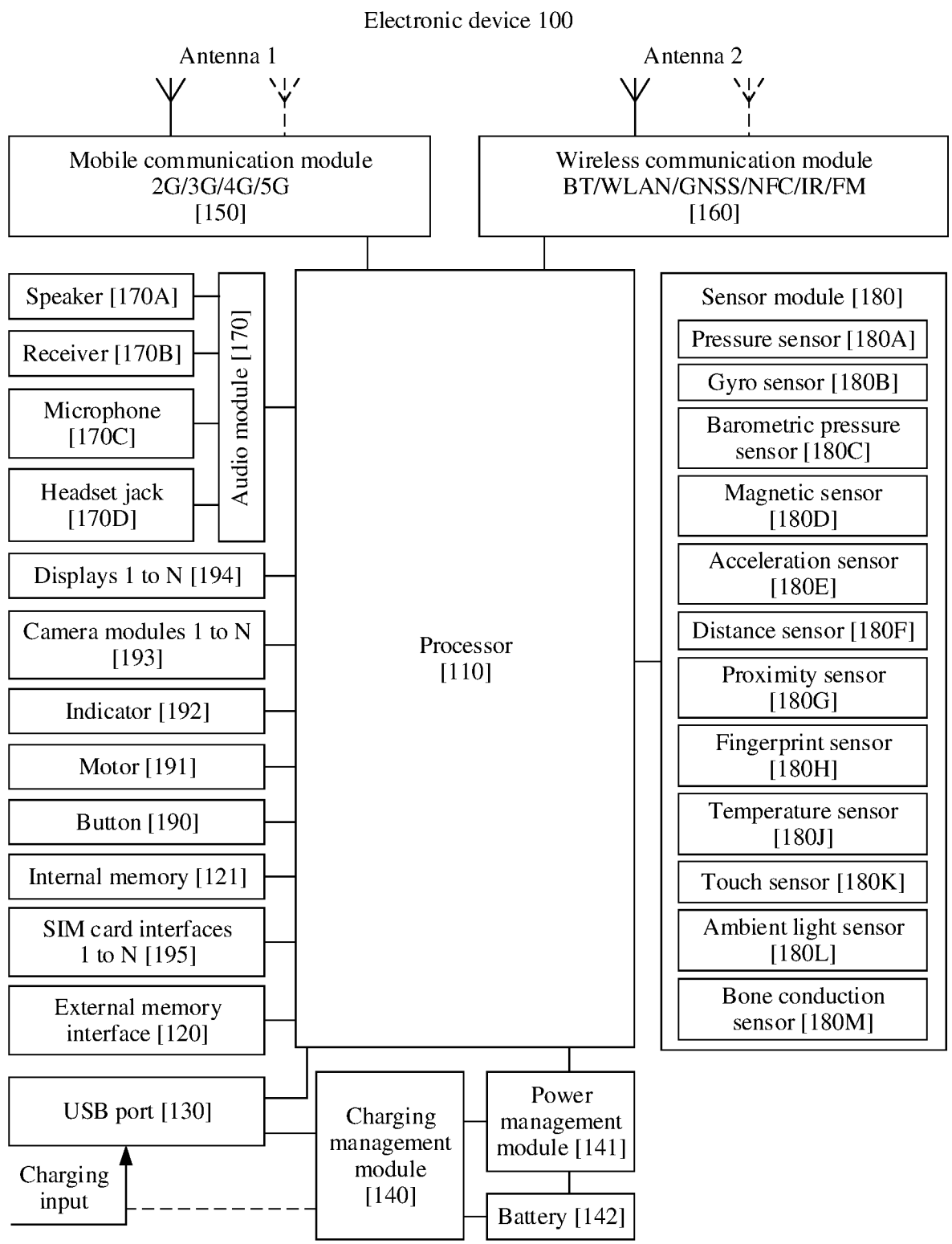
FIG. 1A is a schematic diagram of a structure of an electronic device according to an embodiment of the present disclosure.

FIG. 1A is an example of a schematic diagram of a structure of an electronic device 100.

It should be understood that the electronic device 100 shown in the figure is merely an example, and the electronic device 100 may have more or fewer components than those shown in the figure, may combine two or more components, or may have different component configurations. Various components shown in the figure may be implemented in hardware, software, or a combination of hardware and software that includes one or more signal processing and/or application-specific integrated circuits.

As shown in FIG. 1A, the electronic device 100 may include a processor 110, an external memory interface 120, an internal memory 121, a universal serial bus (USB) port 130, a charging management module 140, a power management module 141, a battery 142, an antenna 1, an antenna 2, a mobile communication module 150, a wireless communication module 160, an audio module 170, a speaker 170A, a receiver 170B, a microphone 170C, a headset jack 170D, a sensor module 180, a button 190, a motor 191, an indicator 192, a camera module 193, a display 194, a subscriber identity module (SIM) card interface 195, and the like. The sensor module 180 may include a pressure sensor 180A, a gyro sensor 180B, a barometric pressure sensor 180C, a magnetic sensor 180D, an acceleration sensor 180E, a distance sensor 180F, a proximity sensor 180G, a fingerprint sensor 180H, a temperature sensor 180J, a touch sensor 180K, an ambient light sensor 180L, a bone conduction sensor 180M, and the like.

The following specifically describes each part of the electronic device 100 with reference to FIG. 1A.

The processor 110 may include one or more processing units. For example, the processor 110 may include an application processor (AP), a modem processor, a graphics processing unit (GPU), an image signal processor (ISP), a controller, a memory, a video codec, a digital signal processor (DSP), a baseband processor, a neural-network processing unit (NPU), and/or the like. Different processing units may be independent components, or may be integrated into one or more processors. The controller may be a nerve center and a command center of the electronic device 100. The controller may generate an operation control signal based on instruction operation code and a time sequence signal, to complete control of instruction reading and instruction execution.

A memory may be further disposed in the processor 110, and is configured to store instructions and data. In some embodiments, the memory in the processor 110 is a cache memory. The memory may store instructions or data that has been used or is cyclically used by the processor 110. If the processor 110 needs to use the instructions or the data again, the processor 110 may directly invoke the instructions or the data from the memory, to avoid repeated access and shorten waiting time of the processor 110. Therefore, system efficiency can be improved.

The processor 110 may run a zoom method provided in embodiments of the present disclosure. The processor may control, in response to a zoom operation (for example, a touch zoom operation, a remote control zoom operation, or a button zoom operation), the camera module 193 to move to a position corresponding to a target focal length based on the zoom operation. When different components are integrated into the processor 110, for example, a CPU and a GPU are integrated, the CPU and the GPU may cooperate to perform the zoom method provided in embodiments of the present disclosure. For example, in the zoom method, an algorithm for controlling movement of the camera module 193 is performed by the CPU, and an algorithm for detecting a zoom operation is performed by the GPU, to implement high processing efficiency.

In some embodiments, the processor 110 may include one or more interfaces. For example, the interface may include an inter-integrated circuit (I2C) interface, an inter-integrated circuit sound (I2S) interface, a pulse code modulation (PCM) interface, a universal asynchronous receiver/transmitter (UART) interface, a mobile industry processor interface (MIPI), a general-purpose input/output (GPIO) interface, a subscriber identity module (SIM) interface, a universal serial bus (USB) interface, and/or the like.

The I2C interface is a two-way synchronization serial bus, and includes one serial data line (SDA) and one serial clock line (SCL). In some embodiments, the processor 110 may include a plurality of groups of I2C buses. The processor 110 may be separately coupled to the distance sensor 180F, a charger, a flashlight, the camera module 193, and the like through different I2C bus interfaces. For example, the processor 110 may be coupled to the distance sensor 180F and the camera module 193 through the I2C interface, so that the processor 110 communicates with the distance sensor 180F and the camera module 193 through the I2C bus interface, to implement a zoom function of the electronic device 100.

The MIPI interface may be configured to connect the processor 110 to peripheral components such as the display 194 and the camera module 193. The MIPI interface includes a camera serial interface (CSI), a display serial interface (DSI), and the like. In some embodiments, the processor 110 communicates with the camera module 193 through the CSI, to implement a photographing function of the electronic device 100.

The GPIO interface may be configured by software. The GPIO interface may be configured as a control signal or a data signal. In some embodiments, the GPIO interface may be configured to connect the processor 110 to the camera module 193, the display 194, the wireless communication module 160, the audio module 170, the sensor module 180, and the like. The GPIO interface may alternatively be configured as an I2C interface, an I2S interface, a UART interface, an MIPI interface, or the like.

It may be understood that an interface connection relationship between the modules illustrated in this embodiment of is merely an example for description, and constitutes no limitation on the structure of the electronic device 100. In some other embodiments of the present disclosure, the electronic device 100 may alternatively use an interface connection manner different from that in the foregoing embodiment, or use a combination of a plurality of interface connection manners.

The electronic device 100 may implement a photographing function through the ISP, the camera module 193, the video codec, the GPU, the display 194, the application processor, and the like.

The ISP is configured to process data fed back by the camera module 193. For example, during photographing, a shutter is pressed, and light is transmitted to a photosensitive element of the camera through a lens. An optical signal is converted into an electrical signal, and the photosensitive element of the camera transmits the electrical signal to the ISP for processing, to convert the electrical signal into a visible image. The ISP may further perform algorithm optimization on noise, brightness, and complexion of the image. The ISP may further optimize parameters such as exposure and a color temperature of a photographing scenario. In some embodiments, the ISP may be disposed in the camera module 193.

The camera module 193 is configured to capture a static image or a video. An optical image of an object is generated through a lens, and is projected onto a photosensitive element. The photosensitive element may be a charge coupled device (CCD) or a complementary metal-oxide-semiconductor (CMOS) photoelectric transistor. The photosensitive element converts an optical signal into an electrical signal, and then transmits the electrical signal to the ISP to convert the electrical signal into a digital image signal. The ISP outputs the digital image signal to the DSP for processing. The DSP converts the digital image signal into an image signal in a standard format such as RGB or YUV. In some embodiments, the electronic device 100 may include one or more camera modules 193.

In the electronic device 100, the camera module 193 may be connected to a processor, and the processor is configured to control the camera module 193. For example, when photographing is required, the processor may generate a processing instruction in response to a photographing operation of a user, and send the processing instruction to the camera module, so that the camera module performs various operations (for example, moving a lens to perform focusing, and outputting data of a photosensitive element).

In an embodiment, the electronic device 100 may include a plurality of camera modules 193. The processor may first determine the target focal length of the electronic device based on an operation of the user, then determine, based on the target focal length of the electronic device, a target focal length corresponding to each camera module 193, and send the target focal length corresponding to each camera module to each camera module 193. For example, each camera module 193 may be provided with one or more chips. Each camera module 193 may receive, by using the one or more chips, data sent by the processor, and control the lens to move by using the drive component, to implement a zoom function. A specific structure of the camera module 193 is specifically described in FIG. 2. Details are not described herein.

The external memory interface 120 may be used to connect to an external storage card, for example, a micro SD card, to extend a storage capability of the electronic device 100. The external memory card communicates with the processor 110 through the external memory interface 120, to implement a data storage function. For example, files such as music and videos are stored in the external storage card.

The internal memory 121 may be configured to store computer-executable program code. The executable program code includes instructions. The internal memory 121 may include a program storage area and a data storage area. The program storage area may store an operating system, an application required by at least one function (for example, a voice playing function or an image playing function), and the like. The data storage area may store data (such as audio data and an address book) created during use of the electronic device 100, and the like. In addition, the internal memory 121 may include a high-speed random access memory, or may include a nonvolatile memory, for example, at least one magnetic disk storage device, a flash memory, or a universal flash storage (UFS). The processor 110 runs instructions stored in the internal memory 121 and/or instructions stored in the memory disposed in the processor, to perform various function applications and data processing of the electronic device 100.

The distance sensor 180F is configured to measure a distance. The electronic device 100 may measure the distance in an infrared manner or a laser manner. In some embodiments, in a photographing scenario, the electronic device 100 may measure a distance through the distance sensor 180F to implement quick focusing.

The touch sensor 180K is also referred to as a touch panel. The touch sensor 180K may be disposed on the display 194. The touch sensor 180K and the display 194 form a touchscreen that is also referred to as a "touch screen". The touch sensor 180K is configured to detect a touch operation performed on or near the touch sensor. The touch sensor may transfer the detected touch operation to the application processor to determine a type of the touch event. A visual output related to the touch operation may be provided through the display 194. In some other embodiments, the touch sensor 180K may also be disposed on a surface of the electronic device 100 at a position different from that of the display 194.

The motor 191 may generate a vibration prompt. The motor 191 may be configured to provide an incoming call vibration prompt and a touch vibration feedback. For example, touch operations performed on different applications (for example, photographing and audio playback) may correspond to different vibration feedback effects. The motor 191 may also correspond to different vibration feedback effects for touch operations performed on different areas of the display 194. Different application scenarios (for example, a time reminder, information receiving, an alarm clock, and a game) may also correspond to different vibration feedback effects. A touch vibration feedback effect may be further customized.

Although not shown in FIG. 1A, the electronic device 100 may further include a Bluetooth apparatus, a positioning apparatus, a flash, a micro projection apparatus, a near field communication (NFC) apparatus, and the like. Details are not described herein.

Figure 1B:
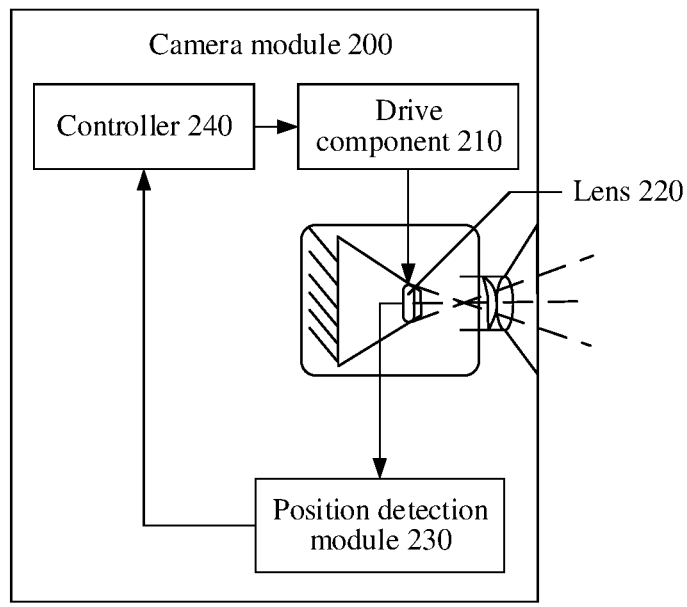
FIG. 1B is a schematic diagram of a structure of a camera module according to an embodiment of the present disclosure.

FIG. 1B is an example of a schematic diagram of a structure of a camera module 200 according to an embodiment of the present disclosure. The camera module 200 may correspond to one camera module 193 in FIG. 1A. The camera module 200 may implement optical zoom. As shown in FIG. 1B, the camera module 200 may include a drive component 210, a lens 220, a position detection module 230, and a controller 240. In an optical zoom process, the controller 240 may generate control information based on a target focal length and send the control information to the drive component 210. The drive component 210 can drive, under control of the control information of the controller 240, the lens 220 to move along a specified track. The position detection module 230 may detect position information of the lens when the lens 220 moves, and send the position information to the controller 240, so that the controller 240 changes, based on the position information, the control information sent to the drive component 210, to accurately control the lens 220 to stop at a position corresponding to the target focal length.

The following first uses FIG. 1B as an example to briefly describe a zoom solution in this embodiment. In this embodiment, an operation region of the lens 220 is partitioned into N subregions, and each subregion is calibrated based on a same preset digital signal range difference output by the position detection module 230, to obtain a position detection relationship corresponding to each subregion. In this way, based on the position detection relationship, the preset digital signal range difference can indicate a length of each subregion. The length of each subregion is less than a length of the entire operation region. Therefore, compared with using the preset digital signal range difference to indicate the length of the entire operation region, the length represented by each digital signal output by the position detection module 230 is smaller. In this case, each time the drive component 210 drives the lens to move for a small distance, the digital signal output by the position detection module 230 changes. It may be learned that, in this implementation, the position detection module 230 can detect a position change of the lens at a finer granularity. This helps improve position detection accuracy of the lens.

In this embodiment, there may be a plurality of possible structures of the drive component 210 and the position detection module 230. For example, in one case, the drive component 210 is a servo motor, and the position detection module 230 is a photoelectric position sensor. In another case, the drive component 210 is an electromagnetic driver, and the position detection module 230 is a magnetostrictive position sensor. For different drive components 210 and position detection modules 230, a position detection relationship corresponding to each subregion is represented in different forms. The following describes an example of a possible structure of the drive component 210 and the position detection module 230, and describes a specific implementation process of the zoom method in this embodiment by using the structure as an example.

Figure 2:
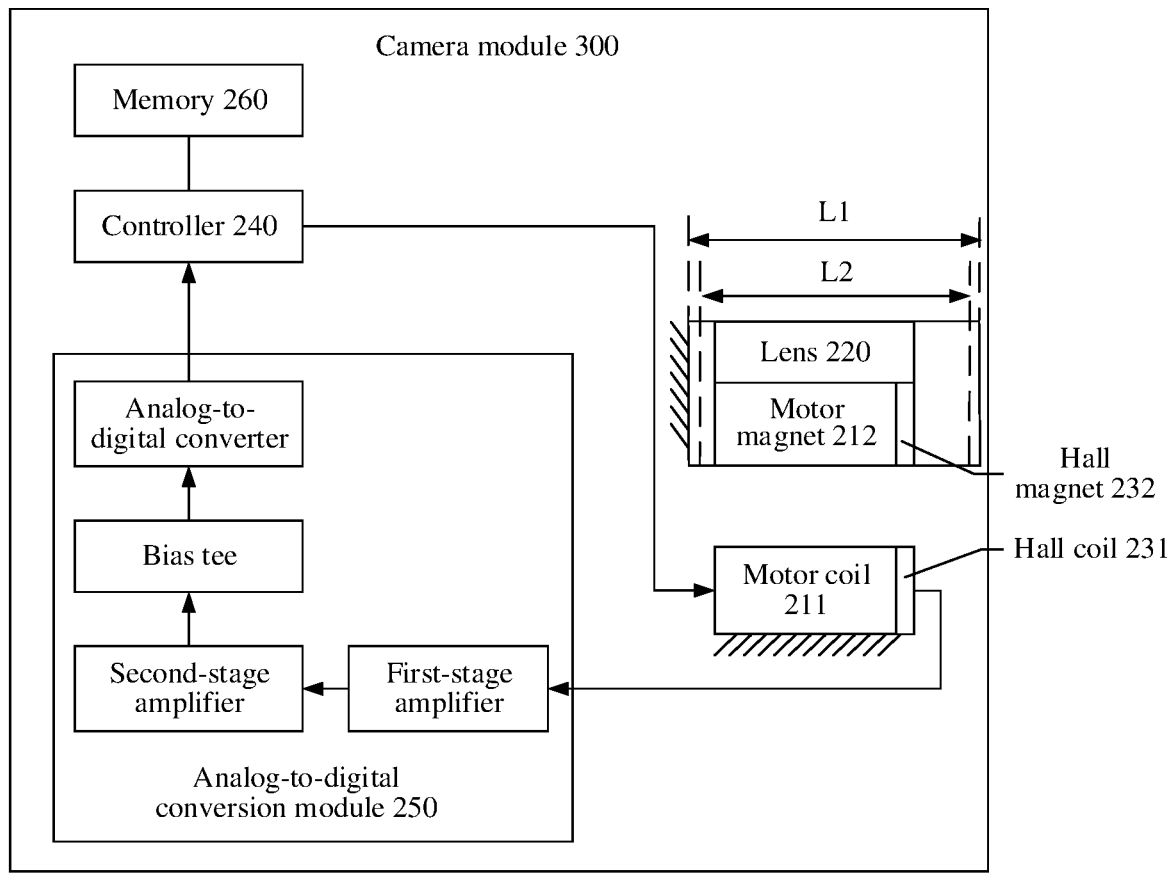
FIG. 2 is an example of a schematic diagram of a circuit structure of a camera module according to an embodiment of the present disclosure.

FIG. 2 is an example of a schematic diagram of a circuit structure of a camera module 300 according to an embodiment of the present disclosure. The camera module 300 may be the camera module 193 in FIG. 1A or the camera module 200 in FIG. 1B. An optical zoom system may include a drive component, a lens 220, a position detection module, and a controller 240. The drive component may include a motor (including a motor coil 211 and a motor magnet 212 shown in the figure). The position detection module may include a Hall effect sensor module (including a Hall coil 231 and a Hall magnet 232 shown in the figure) and an analog-to-digital conversion module 250. The analog-to-digital conversion module 250 includes an analog-to-digital converter (ADC). The motor coil 211 and the Hall coil 231 may be fastened to a base of the camera module 300. The motor magnet 212 and the Hall magnet 232 may be fastened to the lens 220 of the camera module 300. An output end of the Hall coil 231 may be connected to an input end of the analog-to-digital conversion module 250. An output end of the analog-to-digital conversion module 250 may be connected to an input end of the controller 240. An output end of the controller 240 may be connected to the motor coil 211. When the controller 240 applies a drive current to the motor coil 211, electromagnetic induction is generated between the motor magnet 212 and the motor coil 211, so that the motor magnet 212 can drive the lens 220 and the Hall magnet 232 to move. As the Hall magnet 232 moves, a magnetic field between the Hall magnet 232 and the Hall coil 231 changes. The Hall coil 231 can sense the change of the magnetic field, generate a Hall potential difference at two ends of the Hall coil 231, and output an analog voltage signal based on the Hall potential difference. The analog voltage signal is converted into a digital signal by using the ADC in the analog-to-digital conversion module 250, and then is output to the controller 240, so that the controller 240 determines, based on the digital signal, a position after the lens moves.

In this embodiment, the ADC can perform an operation of converting an analog voltage signal into a digital signal based on a specified sampling frequency. For example, when the specified sampling frequency is 1 Kb/s (namely, 1 kilobyte/s), the ADC can collect 1000 analog voltage signals per second, and convert the 1000 analog voltage signals into digital signals. However, a voltage value of an analog voltage signal output by the Hall coil 231 is very small, and usually only several millivolts. It is difficult for the ADC to convert different analog voltage signals of this stage into different digital signals. In this case, an amplifier circuit may be further disposed in the analog-to-digital conversion module 250, and the amplifier circuit is configured to amplify the analog voltage signal output by the Hall coil 231. For example, the amplifier circuit may include a first-stage amplifier and a second-stage amplifier. An input end of the first-stage amplifier is connected to the output end of the Hall coil 231. An output end of the first-stage amplifier is connected to an input end of the second-stage amplifier. An output end of the second-stage amplifier is configured to connect to an input end of the ADC. An amplification coefficient of the first-stage amplifier is far greater than an amplification coefficient of the second-stage amplifier. For example, in a possible design, the amplification coefficient of the first-stage amplifier is 16K, K is a positive integer not greater than 6, and the amplification coefficient of the second-stage amplifier is a real number between 0 and 4, for example, 2.12.

In a possible case, when the lens 220 moves from one position to another position, after two analog voltage signals output by the Hall coil 231 for the two positions are amplified by the amplifier circuit, two amplified analog voltage signals may exceed an amplitude limiting range of the controller 240. Consequently, interference is caused to a subsequent driving process of the motor coil 211, and focusing accuracy is affected. To resolve this problem, a bias tee may be further disposed in the analog-to-digital conversion module 250. An input end of the bias tee is connected to the output end of the second-stage amplifier. An output end of the bias tee is connected to the input end of the ADC. The bias tee is configured to adjust center points of the two amplified analog voltage signals to center points of the two before-amplification analog voltage signals. In this way, after the two analog voltage signals adjusted by the bias tee are converted into two digital signals by the ADC, the two digital signals may be within the amplitude limiting range of the controller 240, so that the controller 240 can accurately calculate the drive current applied to the motor coil 211. This improves focusing accuracy.

As shown in FIG. 2, the camera module 300 may further include a memory 260 and one or more computer programs. The one or more computer programs are stored in the memory 260. The one or more computer programs include instructions. When the instructions are invoked and executed by the controller 240, the controller 240 is enabled to perform the method described in the foregoing content.

In this embodiment, the controller 240, the analog-to-digital conversion module 250, and the memory 260 may be a chip or a circuit, for example, a chip or a circuit that may be disposed in the camera module 300. When the controller 240, the analog-to-digital conversion module 250, and the memory 260 are chips, the controller 240, the analog-to-digital conversion module 250, and the memory 260 may be packaged in one chip, or may be packaged in a plurality of chips. When packaged in a plurality of chips, the controller 240, the analog-to-digital conversion module 250, and the memory 260 may be separately packaged in a separate chip, or the controller 240 and the memory 260 may be packaged in one chip, and the analog-to-digital conversion module 250 may be packaged in another chip, or the controller 240 and the analog-to-digital conversion module 250 may be packaged in one chip, and the memory 260 may be packaged in another chip, which is not described one by one. Certainly, currently most typical application is to package the controller 240, the analog-to-digital conversion module 250, and the memory 260 in one chip. The chip may be a field programmable gate array (FPGA), an application-specific integrated circuit (ASIC), a system on chip (SoC), a network processor (NP), a digital signal processor (DSP), a micro controller unit (MCU), a programmable logic device (PLD), or another integrated chip.

In this embodiment, the camera module 300 may further include a bus system and a communication interface. The controller 240, the analog-to-digital conversion module 250, the memory 260, and the communication interface may be connected through the bus system. For example, when the controller 240, the analog-to-digital conversion module 250, and the memory 260 are packaged in one chip, the chip may be installed on a printed circuit board (PCB) and has a communication interface. The chip is connected to a processor (for example, a central processing unit (CPU)) in an electronic device through a flexible printed circuit (FPC).

In an implementation process, steps in the foregoing methods can be implemented by using a hardware integrated logical circuit in the controller 240, or by using instructions in a form of software. The steps of the method disclosed with reference to embodiments of the present disclosure may be directly performed and completed by a hardware processor, or may be performed and completed by using a combination of hardware and software modules in the controller 240. The software module may be located in a storage medium mature in the art, such as a random access memory, a flash memory, a read-only memory, a programmable read-only memory, an electrically erasable programmable memory, or a register. The storage medium is located in the memory 260. The controller 240 reads information in the memory 260 and completes the steps in the foregoing methods in combination with hardware of the controller 240.

It should be noted that the controller 240 in this embodiment may be an integrated circuit and has a signal processing capability. In an implementation process, the steps in the foregoing method embodiments can be implemented by a hardware integrated logical circuit in the controller 240, or by using instructions in a form of software. The controller 240 may be a general-purpose processor, a digital signal processor (DSP), an application-specific integrated circuit (ASIC), a field programmable gate array (FPGA) or another programmable logic device, a discrete gate or a transistor logic device, or a discrete hardware component. The methods, the steps, and logical block diagrams that are disclosed in embodiments of the present disclosure may be implemented or performed. The general-purpose processor may be a microprocessor, or the processor may be any conventional processor, or the like. The steps of the method disclosed with reference to embodiments of the present disclosure may be directly executed and accomplished by using a hardware decoding processor, or may be executed and accomplished by using a combination of hardware and software modules in the decoding processor. The software module may be located in a storage medium mature in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor.

It may be understood that the memory 260 in this embodiment may be a volatile memory or a non-volatile memory, or may include a volatile memory and a non-volatile memory. The non-volatile memory may be a read-only memory (ROM), a programmable read-only memory (programmable ROM, PROM), an erasable programmable read-only memory (erasable PROM, EPROM), an electrically erasable programmable read-only memory (electrically EPROM, EEPROM), or a flash memory. The volatile memory may be a random access memory (RAM), used as an external cache. Through example but not limitative description, many forms of RAMs may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchronous link dynamic random access memory (synchlink DRAM, SLDRAM), and a direct rambus dynamic random access memory (direct rambus RAM, DR RAM). It should be noted that the memory of the systems and methods described in this specification includes but is not limited to these and any memory of another proper type.

The following first describes some terms and technical solutions in embodiments of the present disclosure.

(1) Mechanical Region and Operation Region of a Lens

In this embodiment, the mechanical region of the lens is a maximum movable stroke of the lens that is defined by a mechanical structure of a camera module, for example, a region L1 shown in FIG. 2. The operation region of the lens is a movable stroke of the lens for implementing a maximum zoom capability of the camera module, for example, a region L2 shown in FIG. 2. It may be learned that the mechanical region of the lens is not less than the operation region of the lens (that is, L1≥L2).

For example, to fully implement the maximum zoom capability of the camera module, a margin usually needs to be reserved between the mechanical region of the lens and the operation region of the lens. In other words, the mechanical region of the lens is greater than the operation region of the lens (that is, L1>L2).

(2) Digital Signal Output by an Analog-to-Digital Conversion Module

In this embodiment, the digital signal output by the analog-to-digital conversion module is a digital signal output by an ADC, and is also referred to as an output code value (in a unit of code). There is a correspondence between the digital signal output by the ADC and an analog signal received by the ADC. If the ADC receives an analog voltage signal, it is assumed that a range of an output digital signal is 1 code to 4096 code, and an analog voltage signal range corresponding to the digital signal range is 0 V to 50 V (volts). In this case, the digital signal output by the ADC can represent a voltage change of 50/4096 V. In this case, if the analog voltage signal received by the ADC is located between 0 V and 50/4096 V, the digital signal output by the ADC is 1 code; if the analog voltage signal received by the ADC is located between 50/4096 V and 100/4096 V, the digital signal output by the ADC is 2 code, . . . , and if the analog voltage signal received by the ADC is located between (50-50/4096) V and 50 V, the digital signal output by the ADC is 4096 code.

In this embodiment, a range of a digital signal that can be output by the ADC is related to a quantity of detected bits of the ADC. For example, when the quantity of detected bits of the ADC is 10, the ADC can represent a maximum of 210 bits, namely, 1024 bits. The 1024 bits may be set. For example, in one subregion, a range of a digital signal output by the ADC is 1 code to 1024 code, and in another subregion, a digital signal output by the ADC may be −1024 code to −1 code. For example, in this embodiment, the quantity of detected bits of the ADC may be 12 or 14. When the quantity of detected bits of the ADC is 12, the ADC can output a maximum of 4096 digital signals. When the quantity of detected bits of the ADC is 14, the ADC can output a maximum of 16384 digital signals.

(3) Configuration Parameter of an Analog-to-Digital Conversion Module

In this embodiment, the configuration parameter of the analog-to-digital conversion module may include one or more parameters of an amplification coefficient of a first-stage amplifier, an amplification coefficient of a second-stage amplifier, and a bias coefficient of a bias tee. Before the electronic device is delivered from a factory, the configuration parameter of the analog-to-digital conversion module in a camera module of an electronic device needs to be calibrated based on a preset digital signal range difference. In this way, after the electronic device is delivered from a factory, the controller in the camera module may perform, based on a calibrated configuration parameter, amplification adjustment or bias adjustment on an analog voltage signal output by a Hall coil.

(4) Resolution of an Analog-to-Digital Conversion Module

In this embodiment, the resolution of the analog-to-digital conversion module is a capability of the analog-to-digital conversion module to detect a position change of a lens. When the position change of the lens exceeds the resolution of the analog-to-digital conversion module, a digital signal output by the analog-to-digital conversion module changes. In this case, a higher resolution of the analog-to-digital conversion module indicates lower position detection accuracy of the analog-to-digital conversion module, and a lower resolution of the analog-to-digital conversion module indicates higher position detection accuracy of the analog-to-digital conversion module.

In an optional implementation, the resolution of the analog-to-digital conversion module may be represented as a ratio of a movement region of the lens to a difference of ranges of digital signals output by the analog-to-digital conversion module. When the difference of the ranges of the digital signals output by the analog-to-digital conversion module is fixed, a larger movement region of the lens indicates a larger movement change amount that is of the lens and that is represented by each digital signal output by the analog-to-digital conversion module. In this case, it is more difficult for the analog-to-digital conversion module to detect the movement change of the lens, resulting in poor focusing accuracy of a camera module. Correspondingly, a smaller movement region of the lens indicates a smaller movement change amount of the lens corresponding to each digital signal output by the analog-to-digital conversion module. In this case, the analog-to-digital conversion module is more likely to detect the movement change of the lens. This helps improve focusing accuracy of the camera module.

However, an existing camera module tends to perform optical zoom at a higher ratio. This gradually increases the movement region of the lens. In this case, if a hardware structure of the analog-to-digital conversion module is not changed, a position change amount that is of the lens and that is represented by each digital signal output by the analog-to-digital conversion module increases. Consequently, it is less likely for the camera module to detect a position movement of the lens, and zoom accuracy of the camera module is poorer. In conclusion, how to improve zoom accuracy of the camera module while implementing high zoom of the camera module needs to be further studied.

In an optional implementation, the mechanical region of the lens may be used as the movement region of the lens. In this manner, calibration can be implemented by applying a large drive current to the motor to control the lens to move to two ends of the mechanical region (a calibration operation is simple). However, the mechanical region of the lens is usually set to a large value (for example, much larger than the operation region of the lens). Therefore, in this case, the resolution of the analog-to-digital conversion module is high. Consequently, detection precision of a lens position change is low, and zoom accuracy of the camera module is affected.

To resolve this problem, in another optional implementation, the movement region of the lens may be set to a value less than the mechanical region of the lens and not less than the operation region of the lens. Because the operation region of the lens is less than the mechanical region of the lens, compared with the foregoing solution, this manner can reduce the resolution of the analog-to-digital conversion module to some extent, and improve the zoom accuracy of the camera module to some extent. However, a best case corresponding to this manner is that the movement region of the lens is equal to the operation region of the lens. Therefore, a capability of reducing the resolution of the analog-to-digital conversion module in this manner is limited. For example, when a range of a digital signal output by the analog-to-digital conversion module is 5 code, and the operation region of the lens is 10 μm (micron), the resolution of the analog-to-digital conversion module can be adjusted to a minimum of 2 μm/code. However, if the resolution of the analog-to-digital conversion module required by a user is 1 μm/code, the resolution and zoom accuracy that are required by the user cannot be implemented in this manner.

In view of this, an embodiment of the present disclosure provides a zoom method. The method is used to partition an operation region of a lens into at least two subregions. Because a stroke of each subregion is less than a stroke of the operation region, a position movement amount that is of the lens and that is represented by each digital signal output by an analog-to-digital conversion module in each subregion is less than a position movement amount of the lens in the entire operation region, and a controller can detect a position change of the lens at a finer granularity. This helps improve zoom accuracy of a camera module.

It should be noted that, in embodiments of the present disclosure, "at least one" means one or more, and "a plurality of" means two or more. A term "and/or" describes an association relationship between associated objects and indicates that three relationships may exist. For example, A and/or B may indicate any one of the following cases: Only A exists, both A and B exist, or only B exists, where A and B may be singular or plural. The character "/" generally represents an "or" relationship between associated objects. At least one of the following items (pieces) or a similar expression thereof refers to any combination of these items, including any combination of singular items (pieces) or plural items (pieces). For example, at least one items (pieces) of a, b, or c may indicate: a, b, c, a and b, a and c, b and c, or a, b, and c, where a, b, and c may be singular or plural.

In addition, in the descriptions of embodiments of the present disclosure, the following terms "first", "second", and "third" are merely intended for a purpose of description, and shall not be understood as indicating or implying relative importance or implicitly indicating a quantity of indicated technical features, for example, "first electrical signal", "second electrical signal", "third electrical signal", "first position information", and "second position information". Therefore, a feature limited by "first", "second", or "third" may explicitly or implicitly include one or more features.

Figure 3A:
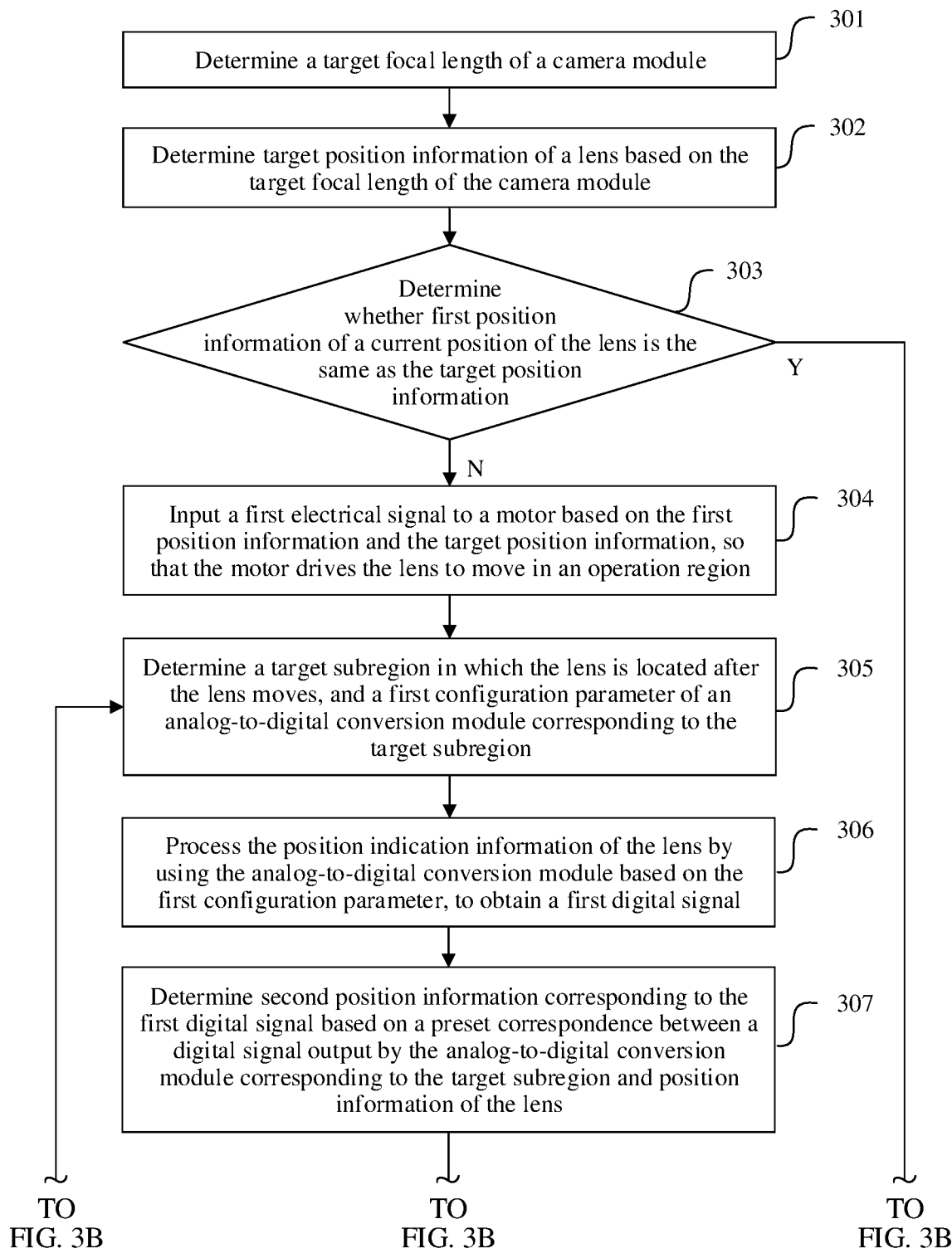
FIG. 3A and FIG. 3B show an example of a schematic flowchart of a focusing method according to an embodiment of the present disclosure.
Figure 3B:
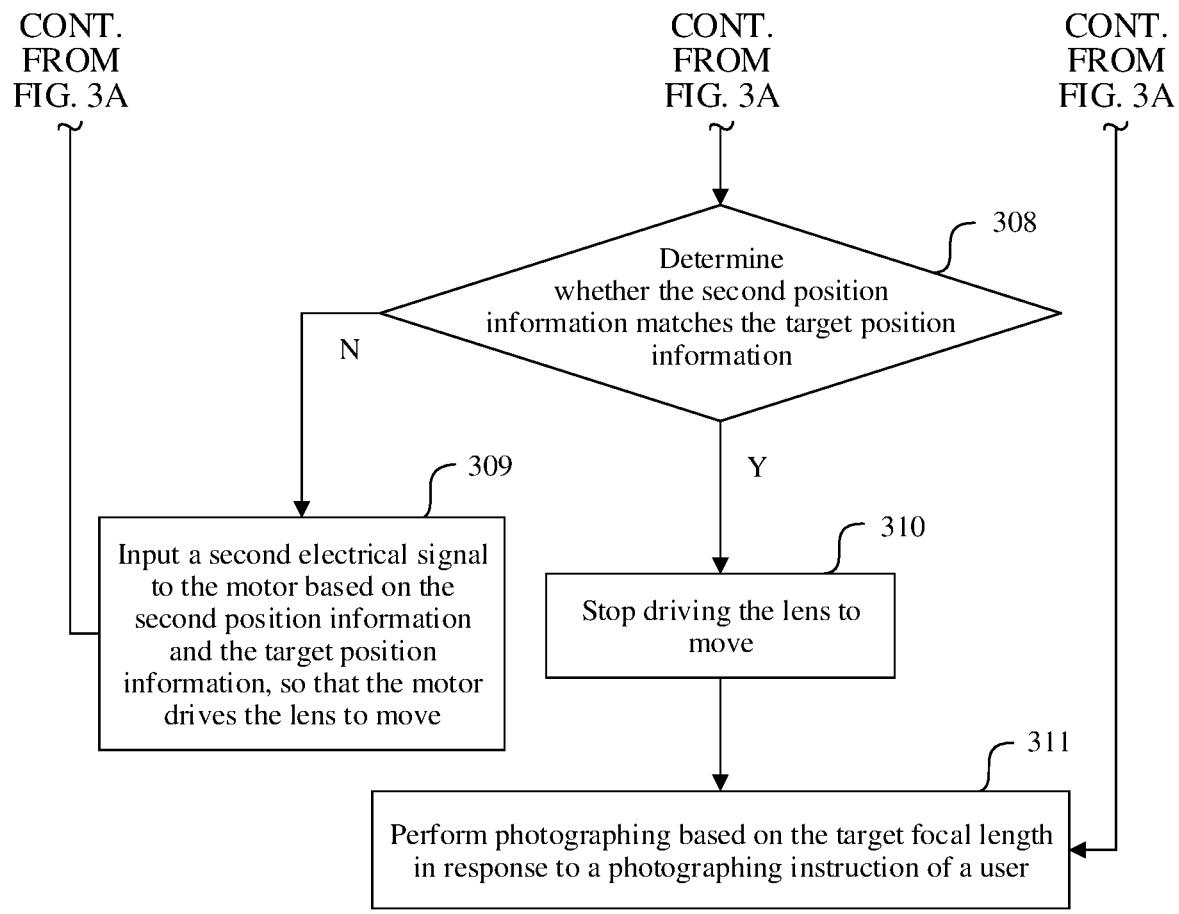

Based on the foregoing content, FIG. 3A and FIG. 3B show an example of a schematic flowchart of a zoom method according to an embodiment of the present disclosure. The method is applied to a camera module. The camera module may be the camera module 193 in FIG. 1A, the camera module 200 in FIG. 1B, or the camera module 300 in FIG. 2. The method may be performed by a controller in a camera module, for example, the controller 240 in FIG. 1B or FIG. 2. As shown in FIG. 3A and FIG. 3B, the method includes the following steps.

Step 301: The controller obtains a target focal length of the camera module.

Figure 4:
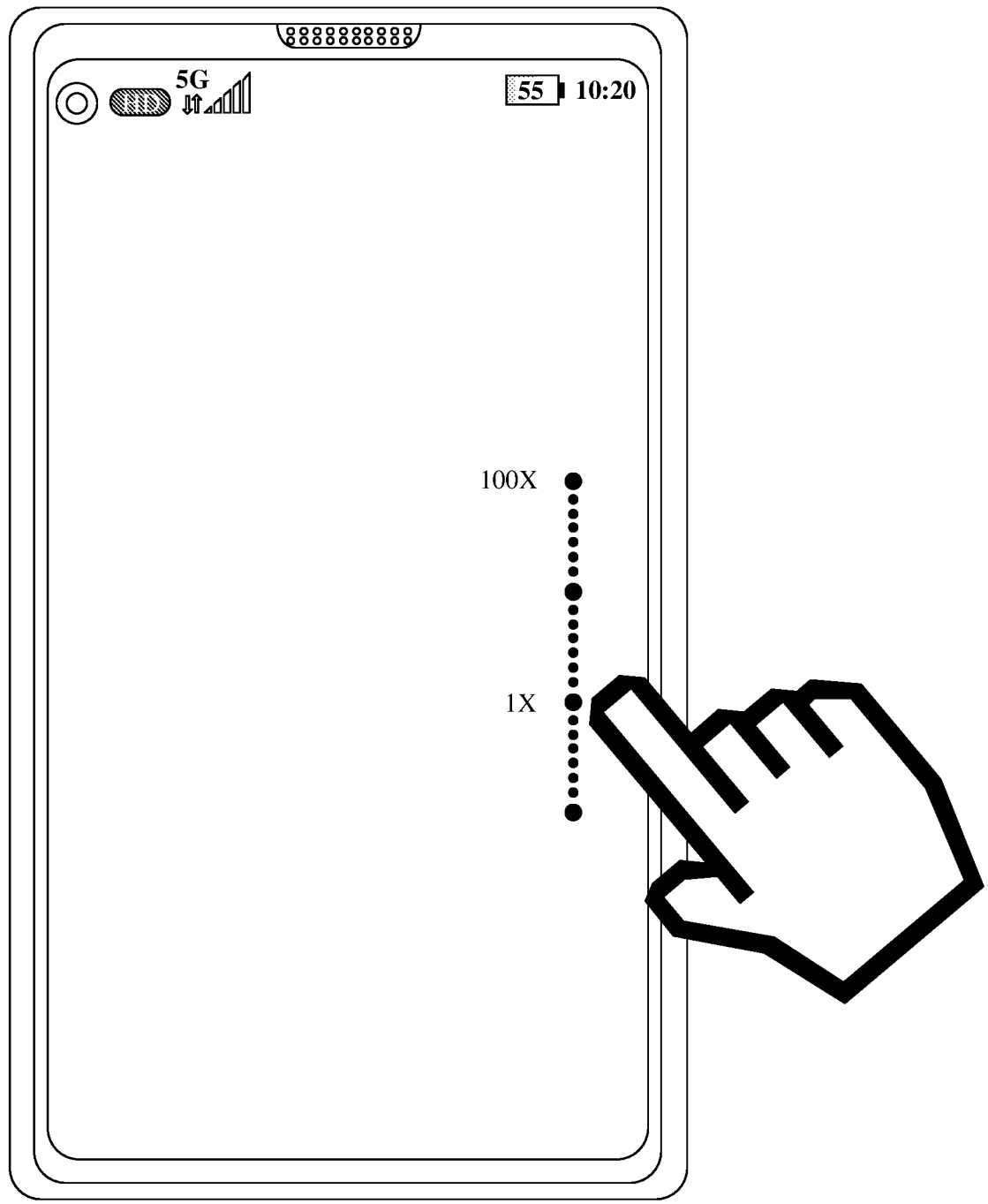
FIG. 4 is an example of a schematic diagram of an operation interface of a sliding touch operation.

For example, an electronic device includes one camera module. In an optional implementation, a processor in the electronic device may first determine the target focal length of the camera module based on a sliding touch operation of a user on a touchscreen of the electronic device, and then send the target focal length of the camera module to the controller in the camera module. FIG. 4 is an example of a schematic diagram of an operation interface of a sliding touch operation. As shown in FIG. 4, when a finger of a user slides up, a focal length is correspondingly increased; and when the finger of the user slides down, the focal length is correspondingly decreased. When the finger of the user slides, a processor may obtain a position in which the finger of the user is located, and then determine, based on a preset correspondence between a position and a focal length, a focal length corresponding to the position, where the focal length is the target focal length. Certainly, FIG. 4 is merely an example for description. The sliding touch operation of the user may alternatively be in another form, for example, may be two-finger touch control. When the two fingers of the user slide outwards, the focal length is correspondingly increased; and when the two fingers of the user slide inwards, the focal length is correspondingly decreased. In this case, the processor determines the target focal length based on a sliding distance of the two fingers of the user and a correspondence between a preset sliding distance and a focal length.

In this embodiment, in an optional implementation, the target focal length is determined based on the sliding touch operation. In another optional implementation, the target focal length may be determined by parsing a voice instruction of the user, or the target focal length may be obtained by parsing a remote control instruction of the user, or the target focal length sent by another component is directly received. This is not limited.

Step 302: The controller determines target position information of a lens in the camera module based on the target focal length of the camera module.

In this embodiment, the camera module may include one or more lenses. When the camera module includes a plurality of (namely, two or more) lenses, each lens may correspond to one optical zoom system shown in FIG. 2. If the camera module includes only one lens, after obtaining the target focal length of the camera module, the controller may further determine the target position information of the lens based on a preset correspondence between the target focal length and the target position information of the lens. If the camera module includes a plurality of lenses, an optical zoom system in which each lens is located may correspond to a same controller. After determining the target focal length of the camera module, the controller may further determine the target position information of each lens based on a preset correspondence between the target focal length and the target position information of each lens. The preset correspondence between the target focal length and the target position information of the lens or the preset correspondence between the target focal length and the target position information of each lens may be pre-stored in the controller before the camera module is delivered from a factory. These correspondences may be obtained through a plurality of experiments and verifications, or may be set based on human experience. This is not specifically limited.

The following embodiments of the present disclosure describe, from a perspective of a lens, how to control the lens to stop at a position corresponding to the target position information of the lens. When the camera module includes a plurality of lenses, the controller may control, in a manner in the following embodiments, each lens to stop at a position corresponding to the target position information of each lens. In other words, in the following descriptions, unless otherwise specified, the lens is one lens.

Step 303: The controller determines whether first position information of a current position of the lens is the same as the target position information, and if the first position information is different from the target position information, performs step 304, or if the first position information is the same as the target position information, performs step 311.

In this embodiment, the controller may store the first position information of the current position of the lens, and the position information may be updated periodically. Specifically, at a moment when the user just turns on a camera, the controller performs an operation of calibrating the lens to a default position. To be specific, the controller sends an electrical signal to a motor coil, and the electrical signal drives a motor magnet to drive the lens to move to the default position. In this case, the first position information that is of the current position of the lens and that is stored in the controller is position information of the default position. After the user turns on the camera, even if the user does not trigger a zoom operation, the controller periodically obtains a digital signal output by the analog-to-digital conversion module, determines the current position of the lens based on the digital signal, and updates, based on the determined current position of the lens, the first position information that is of the current position of the lens and that is stored in the controller. In this manner, even if the current position of the lens is changed by vibration of a mobile phone, the first position information that is of the current position of the lens and that is stored in the controller can be accurate.

Step 304: The controller inputs a first electrical signal to a motor based on the first position information and the target position information, so that the motor drives the lens to move in an operation region.

In an optional implementation, the controller may first calculate, based on the first position information and the target position information, a distance between the current position of the lens and the target position, and then determine, based on a preset correspondence between a distance and an electrical signal, the first electrical signal corresponding to the distance, and may apply a drive current to the motor coil based on the first electrical signal, to drive the motor magnet to drive the lens to move from the current position to the target position. The preset correspondence between a distance and an electrical signal may specifically be a correspondence between a distance, a current value, and power-on time. The correspondence may be obtained through calculation based on an experiment, or may be set based on human experience, or may be obtained through parsing by using a positioning algorithm. This is not limited in the present disclosure.

Table 1 is an example of a schematic table of a preset correspondence between a distance and an electrical signal. As shown in Table 1, if the current position of the lens is 5 μm from the target position (for example, the current position of the lens 220 in FIG. 2 is 5 μm on the left side of the target position), the controller may apply a forward drive current of 2 A to the motor coil, and the drive current gradually decreases with the power-on time. If the current position of the lens is −5 μm from the target position (for example, the current position of the lens 220 in FIG. 2 is 5 μm on the right side of the target position), the controller may apply a negative drive current of 2 A (current unit, ampere) to the motor coil, and the drive current gradually decreases with the power-on time. Herein, μm is a distance unit, namely, micron. A is a current unit, namely, ampere.

TABLE 1

| Distance (micron) | Electrical signal (I: current value, t: power-on time) |
|---|---|
| +5 | I = 2 − 0.5t |
| −5 | I = −2 + 0.5t |
| End distance: 0.5 | I = 0.5 |

It should be noted that, Table 1 is merely a possible example for describing the solution. During specific implementation, the preset correspondence between a distance and an electrical signal may alternatively be in another form. This is not limited.

Step 305: The controller determines, based on position indication information that is of the lens and that is detected by a Hall effect sensor module and a preset correspondence between position indication information and a subregion, a target subregion in which the lens is located after the lens moves, and determines, based on a preset correspondence between a subregion and a configuration parameter of the analog-to-digital conversion module, a first configuration parameter of the analog-to-digital conversion module corresponding to the target subregion.

In this embodiment, the operation region of the lens may include N subregions. A union set of the N subregions may be not smaller than the operation region of the lens. Each of the N subregions may correspond to a configuration parameter of the analog-to-digital conversion module. N is an integer greater than 1. Content of partitioning the N subregions and determining the configuration parameter of the analog-to-digital conversion module corresponding to each subregion is specifically described in FIG. 9, and is not described herein first. It may be understood that the partitioning the operation region into the N subregions is merely an optional implementation. In this embodiment, any region that is not smaller than the operation region and not larger than a mechanical region may be partitioned into the N subregions. Position detection accuracy of each subregion can be high provided that each subregion is smaller than the operation region and each subregion is separately calibrated.

In an optional implementation, when the motor magnet drives the lens and a Hall magnet to move, a Hall coil can sense a magnetic field change of the Hall magnet, to generate a third electrical signal (namely, the position indication information of the lens), and output the third electrical signal to the analog-to-digital conversion module. Correspondingly, the controller may further collect the third electrical signal output by the Hall coil, determine, based on a preset correspondence between the electrical signal output by the Hall coil and a subregion in which the lens is located, a target subregion in which the lens is located after the lens moves, and use a configuration parameter of an analog-to-digital converter module corresponding to the target subregion as the first configuration parameter. The third electrical signal may be an analog voltage signal.

For ease of understanding, a specific example is provided below for description.

Figure 5:
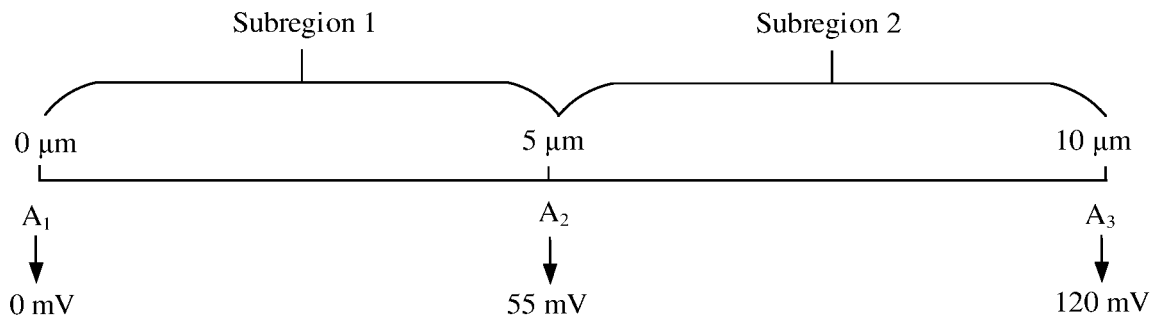
FIG. 5 is an example of a diagram of a preset correspondence between an electrical signal output by a Hall coil and a subregion in which a lens is located.

FIG. 5 is an example of a diagram of a preset correspondence between an electrical signal output by a Hall coil and a subregion in which a lens is located. As shown in FIG. 5, an operation region (0-10 μm) of the lens is partitioned into a subregion 1 (0-5 μm) and a subregion 2 (5-10 μm). The subregion 1 and the subregion 2 have no overlapping region. The subregion 1 includes an endpoint $A_1$ and an endpoint $A_2$. When the lens (namely, a Hall magnet) is located at the endpoint $A_1$, an analog voltage signal output by the Hall coil is 0 mV. When the lens is located at the endpoint $A_2$, an analog voltage signal output by the Hall coil is 55 mV. Therefore, when a position of the lens is a position in the subregion 1, an analog voltage signal output by the Hall coil is a value between 0 mV and 55 mV. Correspondingly, the subregion 2 includes an endpoint $A_2$ and an endpoint $A_3$. When the lens is located at the endpoint $A_2$, an analog voltage signal output by the Hall coil is 55 mV. When the lens is located at the endpoint $A_3$, an analog voltage signal output by the Hall coil is 120 mV. Therefore, when a position of the lens is a position in the subregion 2, an analog voltage signal output by the Hall coil is a value between 55 mV and 120 mV.

Based on the correspondence shown in FIG. 5, after the lens moves, if the analog voltage signal output by the Hall coil is not less than 0 mV and not greater than 55 mV, a target subregion in which the lens is located after the lens moves is determined as the subregion 1. Therefore, a first configuration parameter is a configuration parameter of the analog-to-digital conversion module corresponding to the subregion 1. If the analog voltage signal output by the Hall coil is greater than 55 mV and not greater than 120 mV, a target subregion in which the lens is located after the lens moves is determined as the subregion 2. Therefore, a first configuration parameter is a configuration parameter of the analog-to-digital conversion module corresponding to the subregion 2. It should be noted that an example in which the endpoint $A_2$ is classified into the subregion 1 is used for description herein. Whether the endpoint $A_2$ belongs to the subregion 1 or the subregion 2 may be set by a user based on an actual requirement, and is not limited.

In this embodiment, because different subregions correspond to different configuration parameters of the analog-to-digital conversion module, when the lens moves from one subregion to another subregion, the configuration parameter of the analog-to-digital conversion module is also switched. However, at an instant of switching the configuration parameter, because the analog voltage signal output by the Hall coil remains unchanged, analog voltage signals obtained after the analog voltage signal is adjusted based on different configuration parameters are also different. Consequently, the analog voltage signal or an output digital signal or both of the analog-to-digital conversion module jump. Related content of the jump is described in the following embodiments, and is not described herein first.

Figure 6:
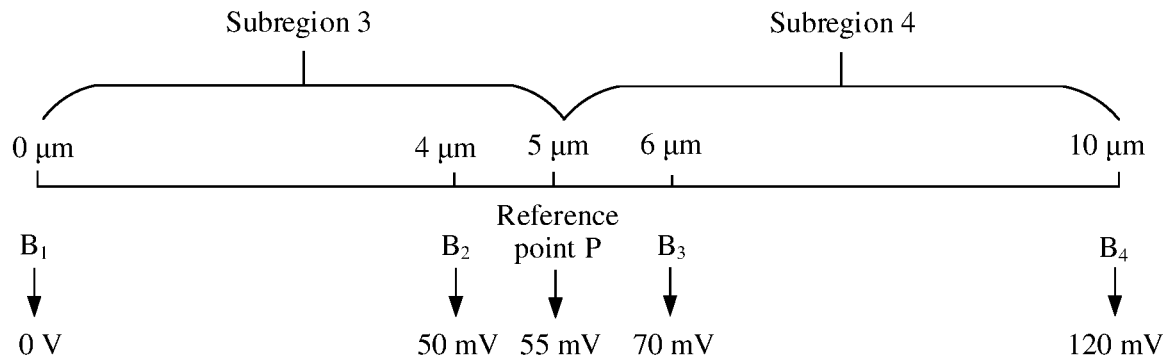
FIG. 6 is an example of a diagram of another preset correspondence between an electrical signal output by a Hall coil and a subregion in which a lens is located.

FIG. 6 is an example of a diagram of another preset correspondence between an electrical signal output by a Hall coil and a subregion in which a lens is located. As shown in FIG. 6, an operation region (0-10 μm) of the lens is partitioned into a subregion 3 (0-6 μm) and a subregion 4 (4-10 μm). The subregion 3 and the subregion 4 have no overlapping region (4-6 μm). The subregion 3 includes an endpoint $B_1$ and an endpoint $B_3$. When the lens (namely, a Hall magnet) is located at the endpoint $B_1$, an analog voltage signal output by the Hall coil is 0 mV. When the lens is located at the endpoint $B_3$, an analog voltage signal output by the Hall coil is 70 mV. Therefore, when a position of the lens is a position in the subregion 3, an analog voltage signal output by the Hall coil is a value between 0 mV and 70 mV. Correspondingly, the subregion 4 includes an endpoint $B_2$ and an endpoint $B_4$. When the lens is located at the endpoint $B_2$, an analog voltage signal output by the Hall coil is 50 mV. When the lens is located at the endpoint $B_4$, an analog voltage signal output by the Hall coil is 120 mV. Therefore, when a position of the lens is a position in the subregion 4, an analog voltage signal output by the Hall coil is a value between 50 mV and 120 mV.

Based on the correspondence shown in FIG. 6, after the lens moves, if the analog voltage signal output by the Hall coil is not less than 0 mV and not greater than 50 mV, a target subregion in which the lens is located after the lens moves is determined as the subregion 3. Therefore, a first configuration parameter is a configuration parameter of the analog-to-digital conversion module corresponding to the subregion 3. If the analog voltage signal output by the Hall coil is not less than 70 mV and not greater than 120 mV, a target subregion in which the lens is located after the lens moves is determined as the subregion 4. Therefore, a first configuration parameter is a configuration parameter corresponding to the subregion 4. However, if the analog voltage signal output by the Hall coil is greater than 50 mV and less than 70 mV, the analog voltage signal is located in both an analog voltage signal range of the subregion 3 and an analog voltage signal range of the subregion 4. In this case, the lens is located in the overlapping region (4-6 μm) of the subregion 3 and the subregion 4. In this scenario, a controller may determine, in multiple manners, the target subregion in which the lens is located after the lens moves and the first configuration parameter. For example, a configuration parameter of the analog-to-digital conversion module corresponding to one of the subregions may be randomly used as the first configuration parameter. The following describes two possible implementations by using examples.

In a possible implementation, for the subregion 3 and the subregion 4 that have an overlapping region, the controller may pre-use a preset position in the overlapping region as a reference point P. The reference point P may be any point in the overlapping region, for example, may be a point $B_2$, or may be a point $B_3$, or may be a center point of the point $B_2$ and the point $B_3$. Assuming that the lens is located at the reference point P, the analog voltage signal output by the Hall coil is 55 mV. In this case, if the analog voltage signal output by the Hall coil is not less than 0 mV and not greater than 55 mV, a target subregion in which the lens is located after the lens moves is determined as the subregion 3. Therefore, a first configuration parameter is a configuration parameter corresponding to the subregion 3. If the analog voltage signal output by the Hall coil is greater than 55 mV and not greater than 120 mV, a target subregion in which the lens is located after the lens moves is determined as the subregion 4. Therefore, a first configuration parameter is a configuration parameter corresponding to the subregion 4. This implementation is applicable to a scenario in which the lens continuously moves. For example, the lens continuously moves from the subregion 3 to the subregion 4 without moving back and forth. In this case, the reference point may be set to a fixed point in the overlapping region. The target subregion in which the lens is located after the lens moves may be determined by comparing an analog voltage signal output by the Hall coil after the lens moves with both of an analog voltage signal of one endpoint of each subregion and an analog voltage signal of the reference point. The implementation is simple.

In another possible implementation, for the subregion 3 and the subregion 4 that have an overlapping region, when the lens moves to the overlapping region, the controller uses a subregion in which the lens is located at a previous moment as the target subregion in which the lens is located after the lens moves. In other words, a configuration parameter is switched only when the lens moves to an endpoint of one subregion relative to another subregion. For example, if the lens moves from the subregion 3 to the subregion 4, provided that the analog voltage signal output by the Hall coil is not less than 0 mV and not greater than 70 mV, a target subregion in which the lens is located after the lens moves is considered as the subregion 3, and a first configuration parameter is a configuration parameter corresponding to the subregion 3. Only when the analog voltage signal output by the Hall coil is greater than 70 mV and not less than 120 mV, a target subregion in which the lens is located after the lens moves is considered as the subregion 4, and a first configuration parameter is a configuration parameter corresponding to the subregion 4. Correspondingly, if the lens moves from the subregion 4 to the subregion 3, provided that the analog voltage signal output by the Hall coil is not less than 50 mV and not greater than 120 mV, a target subregion in which the lens is located after the lens moves is considered as the subregion 4, and a first configuration parameter is a configuration parameter corresponding to the subregion 4. Only when the analog voltage signal output by the Hall coil is not less than 0 mV and less than 50 mV, a target subregion in which the lens is located after the lens moves is considered as the subregion 3, and a first configuration parameter is a configuration parameter corresponding to the subregion 3. This implementation is applicable to a scenario in which the lens moves back and forth near the overlapping region. For example, the lens moves back and forth between the endpoint $B_2$ and the endpoint $B_3$. In this case, if a subregion in which the lens is located at a previous moment is the subregion 3, the lens is always in the subregion 3 provided that the lens does not move to the endpoint $B_3$. In this way, the first configuration parameter is always the configuration parameter corresponding to the subregion 3. In this manner, a quantity of times of switching a configuration parameter can be reduced, and a quantity of jumps of the analog voltage signal of the analog-to-digital conversion module and/or a quantity of jumps of the output digital signal can be reduced. This helps maintain stability of an optical zoom system.

Step 306: The controller processes the position indication information by using the analog-to-digital conversion module based on the first configuration parameter, to output a first digital signal.

During specific implementation, the controller may set an amplification coefficient of a first-stage amplifier, an amplification coefficient of a second-stage amplifier, and a bias parameter of a bias tee in the analog-to-digital conversion module as the first configuration parameter. In this way, when the Hall magnet moves, the third electrical signal output by the Hall coil is output to the ADC after being subjected to amplification adjustment and/or bias adjustment based on the first configuration parameter. The ADC samples an adjusted analog voltage signal at a specified frequency, converts a sampled analog voltage signal into the first digital signal, and outputs the first digital signal to the controller.

Step 307: The controller determines the second position information corresponding to the first digital signal based on a preset correspondence between the digital signal output by the analog-to-digital conversion module corresponding to the target subregion and the position information of the lens.

In an optional implementation, for each subregion, the preset correspondence between the digital signal output by the analog-to-digital conversion module and the position information of the lens may be a linear relationship. In this case, the preset correspondence between the digital signal output by the analog-to-digital conversion module and the position information of the lens may include the following features: The digital signal (for example, a digital signal 1) output by the ADC corresponds to the lens at one endpoint of the subregion, and the digital signal (for example, a digital signal 2) output by the ADC corresponds to the lens at the other endpoint of the subregion. An absolute value of a difference between a digital signal 1 and a digital signal 2 of different subregions may be not less than a preset digital signal range difference, and a difference between a digital signal 1 and a digital signal 2 of each subregion may be obtained by adjusting a configuration parameter corresponding to the subregion. Content about how to adjust a configuration parameter so that an absolute value of a difference between a digital signal 1 and a digital signal 2 in different subregions is not less than a preset digital signal range difference is specifically described in FIG. 9, and is not described herein first.

In one case, as shown in FIG. 5, when the lens is located at the endpoint $A_1$, the configuration parameter corresponding to the subregion 1 is used to adjust the analog voltage signal (namely, a fourth electrical signal) output by the Hall coil, so that the ADC outputs a second digital signal $D_{12}$. When the lens is located at the endpoint $A_2$, the configuration parameter corresponding to the subregion 1 is used to adjust the analog voltage signal (namely, a fifth electrical signal) output by the Hall coil, so that the ADC outputs a third digital signal $D_{13}$. When the lens is located at the endpoint $A_2$, the configuration parameter corresponding to the subregion 2 is used to adjust the analog voltage signal (namely, a sixth electrical signal) output by the Hall coil, so that the ADC outputs a fourth digital signal $D_{14}$. When the lens is located at the endpoint $A_3$, the configuration parameter corresponding to the subregion 2 is used to adjust the analog voltage signal (namely, a seventh electrical signal) output by the Hall coil, so that the ADC outputs a fifth digital signal $D_{15}$. If the third digital signal $D_{13}$ is the same as the fourth digital signal $D_{14}$, the preset correspondence between the digital signal output by the analog-to-digital conversion module corresponding to each subregion and the position information of the lens may be shown in FIG. 7. In this case, because there is a same linear relationship between the digital signal and the position of the lens in both the subregion 1 and the subregion 2, a subregion to which the first digital signal belongs may not be determined, but it may be directly determined, based on a slope (namely, $10/(D_{15}-D_{12})$) corresponding to the linear relationship, that the second position information of the lens corresponding to the first digital signal (for example, $D_L$) is $10*D_L/(D_{15}-D_{12})$. In this manner, the position after the lens moves can be directly determined in a simple linear calculation manner. However, when the configuration parameter of the subregion 1 and the configuration parameter of the subregion 2 are calibrated, an absolute value of a difference between the second digital signal and the third digital signal and an absolute value of a difference between the fourth digital signal and the fifth digital signal need to be adjusted to be not less than the preset digital signal range difference, and the third digital signal and the fourth digital signal need to be adjusted to be the same. Therefore, a calibration process may be slightly complex.

In another case, as shown in FIG. 6, when the lens is located at the endpoint $B_1$, the ADC outputs a second digital signal $D_{22}$. When the lens is located at the endpoint $B_3$, the ADC outputs a third digital signal $D_{23}$. When the lens is located at the endpoint $B_2$, the ADC outputs a fourth digital signal $D_{24}$. When the lens is located at the endpoint $B_4$, the ADC outputs a fifth digital signal $D_{25}$. If the third digital signal $D_{23}$ is different from the fourth digital signal $D_{24}$, the preset correspondence between the digital signal output by the analog-to-digital conversion module and the position information of the lens may be shown in FIG. 8. In this case, when the position after the lens moves is located in the overlapping region of the subregion 3 and the subregion 4, the first digital signal (for example, $D_L$) output by the ADC corresponds to two pieces of position information. For example, $D_L$ corresponds to a position 5.5 µm in the subregion 3, and $D_L$ corresponds to a position 4.5 µm in the subregion 4. In this case, the second position information corresponding to the $D_L$ may be selected as position information that is in a same subregion as the third position information. For example, if the subregion is determined based on a solution in which a boundary point 6 µm of the subregion 3 is used as a reference point, when the lens moves from the subregion 3 to the subregion 4, because the lens has not moved to the boundary point 6 µm, the second position information corresponding to the $D_L$ may be 5.5 µm in the subregion 3.

In this embodiment, the foregoing two cases are merely two examples for description. In another possible case, a range of a digital signal output by the ADC may be alternatively set based on a user requirement. For example, ranges of digital signals output by the ADC corresponding to two subregions may be set to be consistent. In this way, regardless of whether the position after the lens moves is in the overlapping region, the digital signal output by the ADC corresponding to the position after the lens moves corresponds to two pieces of position information. In this case, position information that is in the two pieces of position information and that is in a same subregion as the third position information may be determined as the second position information.

Step 308: The controller determines whether the second position information matches the target position information, and step 309 is performed if the second position information does not match the target position information, or step 310 is performed if the second position information matches the target position information.

Step 309: The controller inputs a second electrical signal to the motor based on the second position information and the target position information, so that the motor drives the lens to move.

In an optional implementation, that the second position information does not match the target position information may specifically mean that the second position information does not satisfy an end distance by which the lens stops at the target position information. As shown in Table 1, the controller may further store the end distance. After the controller calculates, based on the second position information and the target position information, a distance between the position after the lens moves and the target position, if the distance is not equal to the end distance, the controller may re-determine a second electrical signal corresponding to the distance based on a preset correspondence between a distance and an electrical signal, and may apply a drive current to the motor coil based on the second electrical signal, so that the motor magnet drives the lens to continue to move to the target position. In addition, step 305 to step 309 are repeatedly performed when the lens moves, until the second position information matches the target position information.

Step 310: The controller stops driving the lens to move.

In an optional implementation, that the second position information matches the target position information may specifically mean that the second position information satisfies an end distance by which the lens stops at the target position information. As shown in Table 1, the controller may further store a correspondence between the end distance and an electrical signal. After the controller calculates, based on the second position information and the target position information, a distance between the position obtained after the lens moves and the target position, if the distance is equal to the end distance, the controller may apply a drive current to the motor coil based on the electrical signal corresponding to the end distance, so that the motor magnet drives the lens to stop at the target position. The end distance may be a value slightly greater than 0. Force generated by the electrical signal corresponding to the end distance is offset by gravitational force and friction force of the lens. In this way, when the motor magnet is driven based on the electrical signal corresponding to the end distance, although the force corresponding to the electrical signal is offset, the motor magnet can still drive the lens to continue to move through inertia, so that the lens just stops at the target position.

In this embodiment, the operation region of the lens is partitioned into at least two subregions, so that each digital signal output by the analog-to-digital conversion module can represent a smaller position change amount of the lens. For example, in a previous solution, 5 code is used to represent an operation region of 10 µm. In this case, a resolution of the analog-to-digital conversion module can reach a minimum of 2 code/µm. In other words, the controller can only detect the lens at 2 µm, 4 µm, 6 µm, and 8 µm, and adjust a current applied to the motor coil at these positions. However, in the solution of the present disclosure, the 10 µm operation region is partitioned into two subregions (it is assumed that both the two subregions are 5 µm), so that a resolution of the analog-to-digital conversion module can be reduced to 1 code/µm. Therefore, the controller can detect the lens at 1 µm, 2 µm, 3 µm, . . . , 7 µm, 8 µm, and 9 µm, and adjust a current applied to the motor coil at these positions. In this way, the controller can more accurately control the current applied to the motor coil, so that the lens more accurately stops at the target position.

Step 311: The controller performs photographing based on the target focal length in response to a photographing instruction of the user.

In this embodiment, when the user taps a photographing button on the screen of the electronic device, the processor in the electronic device may detect a photographing operation of the user, and may generate a processing instruction based on the photographing operation, and send the processing instruction to the controller, so that the controller performs photographing based on the processing instruction.

In this embodiment, a position of the lens is continuously detected when the lens moves, and the lens is controlled to move in different subregions based on the position of the lens, so that the lens can more accurately stop at a position corresponding to the target focal length. This helps improve focusing accuracy of the camera module. Further, the operation region of the lens is partitioned into at least two subregions, so that each subregion may be smaller than the operation region. In this way, if ranges of digital signals output by a position detection module are consistent, a position movement amount (namely, the movement distance) that is of the lens and that is represented by each digital signal output by the position detection module in each subregion is less than a position movement amount in the entire operation region, so that the controller can detect a position change of the lens at a finer granularity. This improves position detection accuracy of the lens. The lens is controlled to move based on a more accurate position. This can further improve zoom accuracy of the camera module.

Figure 9:
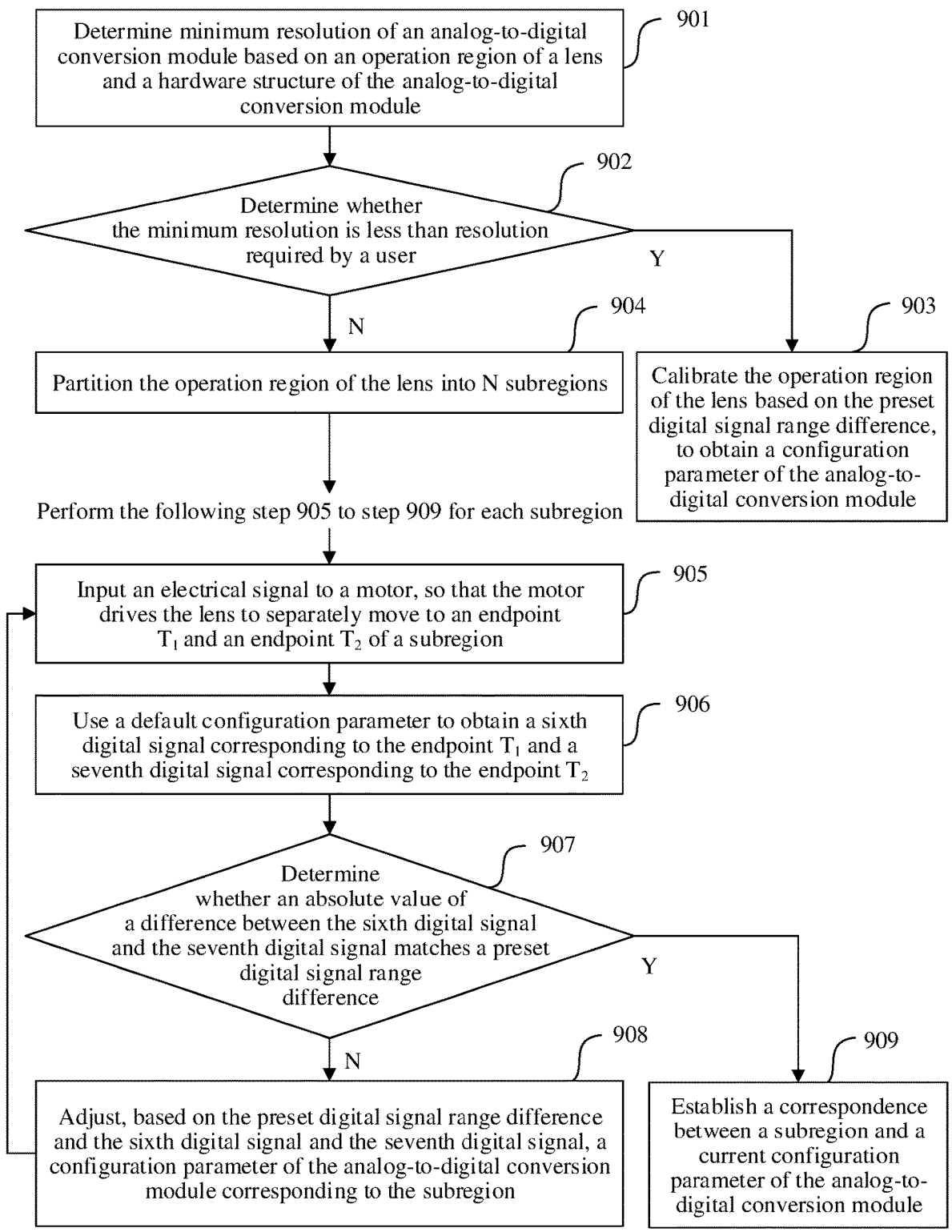
FIG. 9 is an example of a schematic flowchart of a calibration method according to an embodiment of the present disclosure.

FIG. 9 is an example of a schematic flowchart of a calibration method according to an embodiment of the present disclosure. The method is applied to a camera module, for example, the camera module 193 in FIG. 1A, the camera module 200 in FIG. 1B, or the camera module 300 in FIG. 2. The method may be performed by a controller in a camera module, for example, the controller 240 in FIG. 1B or FIG. 2. As shown in FIG. 9, the method includes the following steps.

Step 901: The controller determines a minimum resolution of an analog-to-digital conversion module based on an operation region of a lens and a hardware structure of the analog-to-digital conversion module.

In this embodiment, the controller may first determine, based on a quantity of bits of an ADC, a quantity of digital signals that can be output by the ADC, and then determine the minimum resolution of the analog-to-digital conversion module based on the operation region of the lens and the quantity of digital signals that can be output by the ADC. For example, if the operation region of the lens is 10 µm, and the quantity of digital signals that can be output by the ADC is 5 code, the minimum resolution of the analog-to-digital conversion module is 2 µm/code. This indicates that each digital signal output by the analog-to-digital conversion module can represent a minimum position change amount of 2 µm of the lens.

It should be noted that the "determining the resolution of the analog-to-digital conversion module based on the hardware structure of the analog-to-digital conversion module" is merely an optional implementation. In another optional implementation, considering that a specific digital signal range is reserved for the analog-to-digital conversion module, so that the analog-to-digital conversion module can still be used in subsequent emergency, the resolution of the analog-to-digital conversion module may alternatively be determined based on a preset digital signal range difference. The preset digital signal range difference may be preset by a user based on a plurality of factors. The plurality of factors may include costs of the camera module, user requirements, development difficulty, and the like. The preset digital signal range difference refers to a quantity of digital signals in a preset digital signal range. The difference may be less than a quantity of the digital signals that can be output by the ADC. For example, if a quantity of detected bits of the ADC is 12, the preset digital signal range difference may be any integer not greater than 4096, for example, 400.

Step 902: The controller determines whether the minimum resolution of the analog-to-digital conversion module is less than a resolution required by the user, and step 903 is performed if the minimum resolution is less than the resolution required by the user, or step 904 is performed if the minimum resolution is not less than the resolution required by the user.

Step 903: The controller calibrates the operation region of the lens based on the preset digital signal range difference, to obtain a configuration parameter of the analog-to-digital conversion module.

For example, if the resolution required by the user is 3 µm/code, it indicates that the user expects that each digital signal output by the analog-to-digital conversion module can represent a position change of 3 µm of the lens. Actually, each digital signal output by the analog-to-digital conversion module can represent a position change of 2 µm of the lens. In this case, accuracy can meet a user requirement. In this case, the controller may directly calibrate the operation region of the lens based on ranges of the digital signals that can be output by the analog-to-digital conversion module, to obtain the configuration parameter of the analog-to-digital conversion module. Certainly, the operation region of the lens may alternatively be calibrated based on the preset digital signal range difference, to obtain the configuration parameter of the analog-to-digital conversion module. This is not limited.

For a specific implementation of obtaining the configuration parameter of the analog-to-digital conversion module through calibration, refer to the following descriptions. Details are not described herein again. In addition, the following describes an example in which each subregion is calibrated based on the preset digital signal range difference. For a solution in which the operation region is calibrated based on the ranges of the digital signals that can be output by the analog-to-digital conversion module, reference may be made. Details are not described again in the present disclosure.

Step 904: The controller partitions the operation region of the lens into N subregions, where N is an integer greater than 1; and performs the following step 905 to step 909 for each subregion.

For example, if the resolution required by the user is 1.5 µm/code, it indicates that the user expects that each digital signal output by the analog-to-digital conversion module can represent a position change of 1.5 µm of the lens. Actually, due to the limited hardware structure of the analog-to-digital conversion module, each digital signal output by the analog-to-digital conversion module can only represent a position change of 2 µm of the lens. In this case, accuracy cannot meet a user requirement. In this case, the controller may partition the operation region of the lens into the N subregions. Each subregion is separately calibrated. A union set of the N subregions may be equal to the operation region of the lens. In this way, any two of the N subregions have no overlapping region. A sum of strokes of the N subregions is exactly equal to a stroke of the operation region of the lens. Alternatively, two or more of the N subregions have an overlapping region. In this way, a sum of strokes of the N subregions is greater than a stroke of the operation region of the lens.

In this embodiment, the operation region of the lens is partitioned into at least two subregions, and a stroke of each subregion can be less than the stroke of the operation region. In this way, compared with a solution in which an operation region is directly calibrated or a mechanical region is directly calibrated, the solution in which each digital signal output by the analog-to-digital conversion module with a same hardware structure represents a less position change amount of the lens can improve accuracy of the analog-to-digital conversion module.

In an optional implementation, a value of N and a stroke of each subregion may be determined based on the resolution required by the user. To ensure that the resolution of the analog-to-digital conversion module in each subregion is less than the resolution required by the user, a ratio of the stroke of each subregion to the preset digital signal range difference needs to be not greater than the resolution required by the user. If the resolution required by the user and the preset digital signal range difference are known, a maximum stroke of each subregion can be calculated. In this way, when the operation region is partitioned, it only needs to be ensured that the stroke of each subregion is not greater than the calculated maximum stroke of each subregion. For example, it is assumed that the operation region of the lens is 10 μm, the preset digital signal range difference is 5 code, and the resolution required by the user is 1.5 μm/code. In this case, it may be obtained through calculation that the maximum stroke of each subregion is 7.5 μm. Therefore, when the subregions are partitioned, it only needs to be ensured that the stroke of each subregion is not greater than 7.5 μm. For example, the operation region of the lens may be partitioned into a subregion 1 and a subregion 2. The subregion 1 corresponds to 0-5 μm, and the subregion 2 corresponds to 5-10 μm. In this way, resolutions of the analog-to-digital conversion module in the subregion 1 and the subregion 2 are both 1 μm/code. Alternatively, the operation region of the lens may be partitioned into a subregion 3 and a subregion 4. The subregion 3 corresponds to 0-6 μm, and the subregion 4 corresponds to 4-10 μm. In this way, resolutions of the analog-to-digital conversion module in the subregion 3 and the subregion 4 are both 1.2 μm/code.

Step 905: The controller inputs an electrical signal to a motor, so that the motor drives the lens to separately move to an endpoint $T_1$ and an endpoint $T_2$ of a subregion. The endpoint $T_1$ and the endpoint $T_2$ are respectively two boundary points of the subregion.

In this embodiment, the controller may first determine position information of a current position of the lens, then calculate, based on the position information of the current position of the lens and the endpoint $T_1$ of the subregion, a distance between the current position of the lens and the endpoint $T_1$ of the subregion, then determine, based on a preset correspondence between a distance and an electrical signal, an electrical signal corresponding to the distance, and apply a drive current to the motor coil based on the electrical signal, so that the motor magnet drives the lens to move to the endpoint $T_1$ of the subregion. After the lens moves to the endpoint $T_1$ of the subregion, the controller may further calculate a distance between the endpoint $T_1$ of the subregion and the endpoint $T_2$ of the subregion based on the endpoint $T_1$ of the subregion and the endpoint $T_2$ of the subregion, then determine, based on the preset correspondence between the distance and the electrical signal, an electrical signal corresponding to the distance, and apply a drive current to the motor coil based on the electrical signal, so that the motor magnet drives the lens to move to the endpoint $T_2$ of the subregion. It should be noted that this is merely an optional implementation. In another optional implementation, after the lens moves to the endpoint $T_1$ of the subregion, the controller may first drive, by using the motor, the lens to move to an original position, and then drive, by using the motor, the lens to move from the original position to the endpoint $T_2$ of the subregion.

Step 906: The controller processes, by using the analog-to-digital conversion module based on a default configuration parameter, position indication information for the lens to move to the endpoint $T_1$ of the subregion, to output a sixth digital signal; and processes, by using the analog-to-digital conversion module based on the default configuration parameter, position indication information for the lens to move to the endpoint $T_2$ of the subregion, to output a seventh digital signal.

In this embodiment, before the subregion is calibrated, the controller may further set the configuration parameter of the analog-to-digital conversion module to the default configuration parameter. For example, an amplification coefficient AmpGain of a first-stage amplifier is set to 0, an amplification coefficient Bias of a second-stage amplifier is set to 0, and a bias coefficient Offset of a bias tee is set to 0. In this way, when the lens moves to the endpoint $T_1$ of the subregion, after amplification adjustment or bias adjustment or both are performed, based on the default configuration parameter, on an analog voltage signal output by a Hall coil, the ADC converts an adjusted analog voltage signal into a sixth digital signal. Correspondingly, when the lens moves to the endpoint $T_2$ of the subregion, after amplification adjustment or bias adjustment or both are performed, based on the default configuration parameter, on an analog voltage signal output by the Hall coil, the ADC converts an adjusted analog voltage signal into a seventh digital signal. For example, it is assumed that a digital signal of the ADC can represent a voltage change of 50/4096 V (approximately 12 mV). In this case, if the analog voltage signal 0 mV corresponding to the endpoint $T_1$ of the subregion and the analog voltage signal 15 mV corresponding to the endpoint $T_2$ of the subregion are respectively changed to 0 mV and 15 mV after amplification adjustment (an amplification coefficient is 0) and offset adjustment (an offset coefficient is 0), the sixth digital signal may be 1 code, and the seventh digital signal may be 2 code.

Step 907: The controller determines whether an absolute value of a difference between the sixth digital signal and the seventh digital signal of the subregion matches the preset digital signal range difference, and step 908 is performed when the absolute value does not match the preset digital signal range difference, or step 909 is performed when the absolute value matches the preset digital signal range difference.

In an optional implementation, that the absolute value of the difference between the sixth digital signal and the seventh digital signal matches the preset digital signal range difference specifically means that the absolute value of the difference between the sixth digital signal and the seventh digital signal is not less than the preset digital signal range difference. In another optional implementation, that the absolute value of the difference between the sixth digital signal and the seventh digital signal does not match the preset digital signal range difference specifically means that the absolute value of the difference between the sixth digital signal and the seventh digital signal is less than the preset digital signal range difference. In the foregoing example, it is assumed that the preset digital signal range difference is 5 code. Because the absolute value of the difference between the sixth digital signal 1 code and the seventh digital signal 2 code is 1 code (less than 5 code), the absolute value of the difference between the sixth digital signal 1 code and the seventh digital signal 2 code does not match the preset digital signal range difference.

Step 908: The controller adjusts, based on the preset digital signal range difference and the sixth digital signal and the seventh digital signal of the subregion, a configuration parameter of the analog-to-digital conversion module corresponding to the subregion.

In an optional implementation, that the controller adjusts a configuration parameter of the analog-to-digital conversion module corresponding to the subregion may include one or more of the following content:

if the absolute value of the difference between the sixth digital signal and the seventh digital signal of the subregion is less than the preset digital signal range difference, increasing an amplification coefficient of the first-stage amplifier and/or increasing an amplification coefficient of the second-stage amplifier; and after the increasing an amplification coefficient of the first-stage amplifier and/or increasing an amplification coefficient of the second-stage amplifier, if center points of a sixth digital signal and a seventh digital signal that are recollected after the adjustment deviate from center points of the sixth digital signal and the seventh digital signal that are not adjusted, adjusting the bias coefficient of the bias tee.

For example, because the amplification coefficient of the first-stage amplifier has a large adjustment amplitude for the analog voltage signal, generally the amplification coefficient of the first-stage amplifier may not be adjusted, but only the amplification coefficient of the second-stage amplifier may be adjusted. When the amplification coefficient of the second-stage amplifier is adjusted to a maximum value and cannot satisfy the preset digital signal range difference, the amplification coefficient of the first-stage amplifier may be readjusted. In addition, after the amplification adjustment, the analog voltage signal output by the Hall coil is adjusted to a large value, and the value may exceed an amplitude limiting range specified by software of the controller after being converted into a digital signal by using the ADC. In this case, the bias coefficient of the bias tee is adjusted, so that a digital signal corresponding to an amplified analog voltage signal can still be within the amplitude limiting range specified by the software of the controller. This facilitates subsequent proper processing of the digital signal, and reduces information distortion probability.

In this embodiment, after the configuration parameter of the analog-to-digital conversion module corresponding to the subregion is adjusted, the controller may re-input an electrical signal to the motor, so that the motor drives the lens to separately move to the endpoint $T_1$ and the endpoint $T_2$ of the subregion. In this case, amplification adjustment or offset adjustment or both are performed, based on the adjusted configuration parameter, on the analog voltage signal output by the Hall coil, and then the ADC converts an adjusted analog voltage signal into a new sixth digital signal and a new seventh digital signal. Then, the controller re-determines whether an absolute value of a difference between the new sixth digital signal and the new seventh digital signal matches the preset digital signal range difference, and if the absolute value of the difference still does not match the preset digital signal range difference, the foregoing steps are repeatedly performed, until the absolute value of the difference between the sixth digital signal and the seventh digital signal matches the preset digital signal range difference.

Step 909: The controller establishes a correspondence between a subregion and a current configuration parameter of the analog-to-digital conversion module. In other words, the current configuration parameter of the analog-to-digital conversion module is used as the configuration parameter of the analog-to-digital conversion module corresponding to the subregion.

In an optional implementation, an output end of the Hall coil may be further connected to a collection apparatus. When the lens moves from an endpoint $T_1$ of each subregion to an endpoint $T_2$, the controller may further collect, by using the collection apparatus, an analog voltage signal output by the Hall coil in this period of time. In addition, an analog voltage signal output by the Hall coil when the lens is located at the endpoint $T_1$ of each subregion and an analog voltage signal output by the Hall coil when the lens is located at the endpoint $T_2$ of each subregion are obtained from the analog voltage signal in this period of time. A preset correspondence between an electrical signal output by the Hall coil and a subregion in which the lens is located is established based on the two analog voltage signals corresponding to the N subregions, as shown in FIG. 5. Alternatively, in an example, if two subregions have an overlapping region, and a reference point is set in the overlapping region, the controller may further apply a specific drive current to the motor, so that the motor drives the lens to move to the reference point. The collection apparatus is used to obtain an analog voltage signal output by the Hall coil when the lens is located at the reference point. In this way, the preset correspondence between the electrical signal output by the Hall coil and the subregion in which the lens is located is established based on the analog voltage signals at two ends corresponding to the N subregions and the analog voltage signal at the reference point of the subregions having the overlapping region, as shown in FIG. 6.

Figure 7:
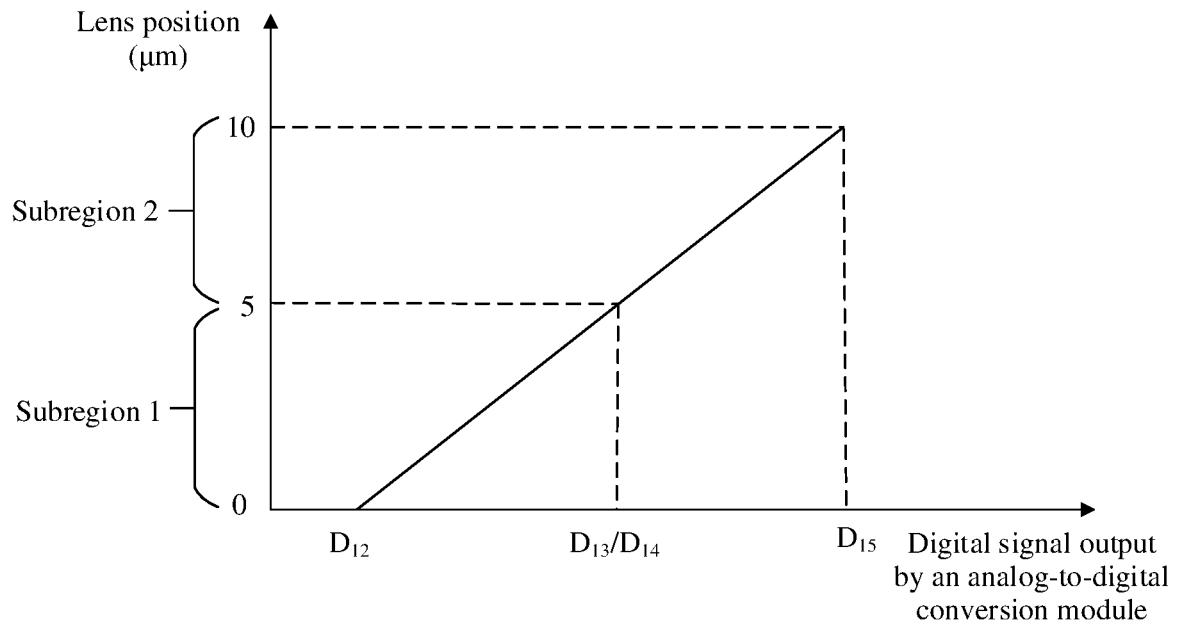
FIG. 7 is an example of a schematic diagram of a preset correspondence between a digital signal output by an analog-to-digital conversion module and position information of a lens.
Figure 8:
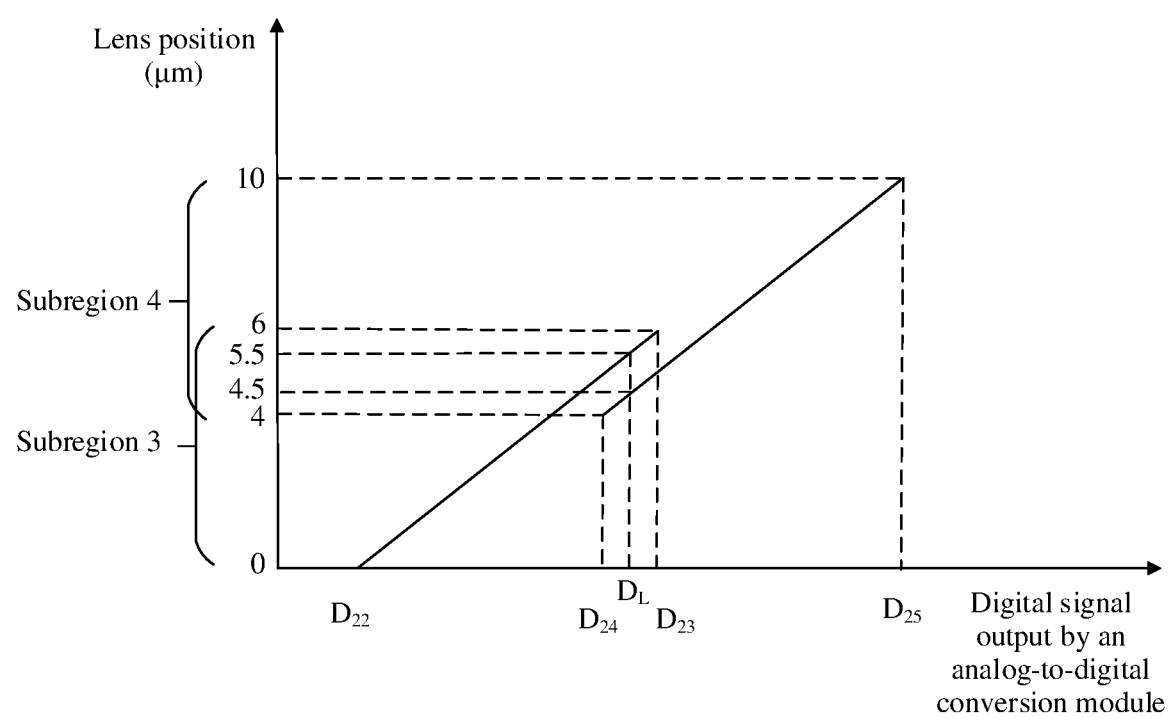
FIG. 8 is an example of a schematic diagram of another preset correspondence between a digital signal output by an analog-to-digital conversion module and position information of a lens.

In this embodiment, if the digital signal output by the analog-to-digital conversion module is linearly associated with the position information of the lens, because each subregion is calibrated based on the preset digital signal range difference, after the absolute value of the difference between the sixth digital signal and the seventh digital signal of the subregion matches the preset digital signal range difference, the controller may further establish, based on the difference between the sixth digital signal and the seventh digital signal and the stroke of the subregion, a correspondence between the digital signal output by the analog-to-digital conversion module of the subregion and the position information of the lens, as shown in FIG. 7 or FIG. 8.

In this embodiment, the operation region is partitioned into the N subregions, so that one digital signal of the analog-to-digital conversion module in each subregion can represent a smaller movement change amount of the lens. In addition, a smaller stroke of the subregion indicates a lower resolution of the analog-to-digital conversion module. In an ideal case, it is assumed that strokes of the N subregions are the same. Compared with a solution in which the operation region is directly calibrated, because a stroke of each of the N subregions is reduced by N times, a resolution of the analog-to-digital conversion module can also be reduced by N times. On this basis, the electronic device can more accurately detect a position change of the lens. This helps control the lens to accurately stop at the target position corresponding to the target focal length, and improves focusing accuracy of the camera module. In addition, in the solution in this embodiment, the N subregions can be partitioned based on the resolution required by the user. Therefore, even if the operation region is large due to a high zoom scenario, a large quantity of subregions can be partitioned, so that the resolution of the analog-to-digital conversion module in each subregion is low. This helps improve definition of a photo or a video taken by the user.

In this embodiment, FIG. 3A and FIG. 3B and FIG. 9 describe an example in which a position detection module includes a Hall effect sensor module and an analog-to-digital conversion module. In this case, a position detection relationship of each subregion includes the configuration parameter of the analog-to-digital conversion module corresponding to the subregion, and the correspondence between the digital signal output by the analog-to-digital conversion module corresponding to the subregion and the position information of the lens in the foregoing content. It may be understood that in another example, when a position detection module is another structure, a position detection relationship corresponding to each subregion may alternatively be in another form. As long as the position detection relationship enables a movement distance that is of the lens and that is represented by each digital signal to be less than a movement distance that is of the lens and that is represented by each digital signal corresponding to a correspondence obtained by calibrating the entire operation region based on a same preset digital signal range difference, the position detection relationship falls within the protection scope of the present disclosure. There are many possible implementations. Details are not described in the present disclosure.

In this embodiment, although each subregion is calibrated based on the same preset digital signal range difference, because component parameters (for example, impedance of the first-stage amplifier, impedance of the second-stage amplifier, and impedance of the bias tee), material friction force, and material lengths between different subregions cannot be completely the same, noise interference between different subregions is different. In this way, even if the stokes of all the subregions are consistent, configuration parameters of the analog-to-digital conversion module obtained by calibrating different subregions are quite likely to be different. In this case, for two subregions having an overlapping region, although analog voltage signals output by the Hall coil when the Hall magnet is located in the overlapping region are the same, because configuration parameters of the analog-to-digital conversion module corresponding to the two subregions are different, when a configuration parameter of the analog-to-digital conversion module is switched at a point in the overlapping region, an analog voltage signal output by the first-stage amplifier, an analog voltage signal received by the second-stage amplifier, an analog voltage signal output by the second-stage amplifier, an analog voltage signal received by the bias tee, an analog voltage signal output by the bias tee, and an analog voltage signal received by the ADC that are obtained by separately adjusting a same analog voltage signal based on the configuration parameters of the two subregions may be different. That is, when the configuration parameter is switched, the foregoing analog voltage signals may jump.

The following describes, by using an example of the analog voltage signal received by the ADC, a jump process of the analog voltage signal when the configuration parameter is switched.

Figure 10:
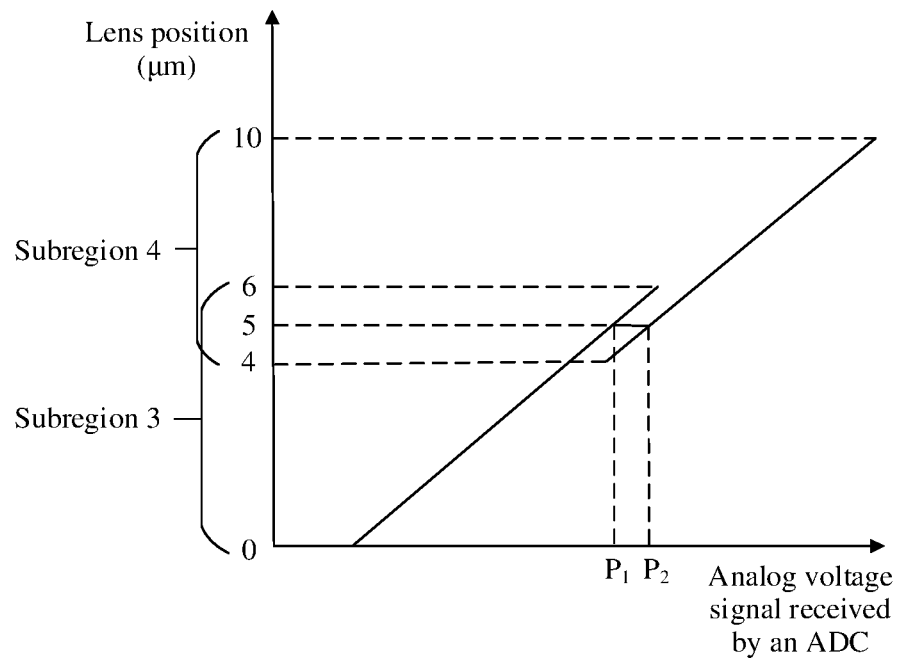
FIG. 10 is an example of a diagram of a correspondence between an analog voltage signal received by an ADC and a position of a lens.

In an optional implementation, for each subregion, the controller may further establish a correspondence between the analog voltage signal received by the ADC when the Hall magnet moves in the subregion and a digital signal output by the ADC, and then obtain, based on the correspondence and a correspondence between the digital signal output by the ADC in the subregion and the position information of the lens, a correspondence between the analog voltage signal received by the ADC when the Hall magnet moves in the subregion and the position information of the lens. Based on the subregion partition manner shown in FIG. 6, FIG. 10 is an example of a diagram of a correspondence between an analog voltage signal received by an ADC and position information of a lens. In this example, an operation region 0-10 µm is partitioned into a subregion 3 and a subregion 4. The subregion 3 corresponds to 0-6 µm, the subregion 4 corresponds to 4-10 µm, and the subregion 3 and the subregion 4 have an overlapping region (4-6 µm). As shown in FIG. 10, in a non-overlapping region of the subregion 3 and the subregion 4, each analog voltage signal received by the ADC corresponds to a unique lens position. In the overlapping region of the subregion 3 and the subregion 4, each analog voltage signal received by the ADC may correspond to two lens positions. One lens position is located in the subregion 3, and the other lens position is located in the subregion 4.

It is assumed that a reference point P set in the overlapping region is located at 5 µm. When the lens moves from the subregion 3 to the subregion 4, the controller first adjusts, based on a configuration parameter of the analog-to-digital conversion module corresponding to the subregion 3, the analog voltage signal output by the Hall coil. When the Hall magnet moves to the reference point at 5 µm, the controller switches the configuration parameter of the analog-to-digital conversion module to a configuration parameter of the analog-to-digital conversion module corresponding to the subregion 4. In other words, the analog voltage signal output by the Hall coil is adjusted based on the configuration parameter of the analog-to-digital conversion module corresponding to the subregion 4. In this case, because the analog voltage signal output by the Hall coil does not change at an instant of switching the configuration parameter, after the analog voltage signal is adjusted based on the new configuration parameter, the analog voltage signal received by the ADC jumps from a position $P_1$ to a position $P_2$ in FIG. 10. Correspondingly, when the lens moves from the subregion 4 to the subregion 3, the controller adjusts, based on the configuration parameter of the analog-to-digital conversion module corresponding to the subregion 4, the analog voltage signal output by the Hall coil. When the Hall magnet moves to the reference point at 5 µm, the controller switches the configuration parameter of the analog-to-digital conversion module to the configuration parameter of the analog-to-digital conversion module corresponding to the subregion 3. In other words, the analog voltage signal output by the Hall coil is adjusted based on the configuration parameter of the analog-to-digital conversion module corresponding to the subregion 3. In this case, because the analog voltage signal output by the Hall coil does not change at an instant of switching the configuration parameter, after the analog voltage signal is adjusted based on the new configuration parameter, the analog voltage signal received by the ADC jumps from the position $P_2$ to the position $P_1$ in FIG. 10.

According to the foregoing content, in an optional implementation, the controller may further determine, by detecting one or more of the following content, whether the configuration parameter of the analog-to-digital conversion module is switched in the zoom process: the analog voltage signal output by the first-stage amplifier, the analog voltage signal received by the second-stage amplifier, the analog voltage signal output by the second-stage amplifier, the analog voltage signal received by the bias tee, the analog voltage signal output by the bias tee, and the analog voltage signal received by the ADC. In this embodiment, the "determining, by detecting the analog voltage signal, whether the configuration parameter is switched" is merely an optional implementation. In another optional implementation, at an instant of switching the configuration parameter, equivalent impedance of the first-stage amplifier, the second-stage amplifier, and the bias tee basically does not change, but the analog voltage signals received and/or output by the first-stage amplifier, the second-stage amplifier, and the bias tee jump, and therefore analog current signals of the first-stage amplifier, the second-stage amplifier, and the bias tee also jumps. In this case, whether the configuration parameter of the analog-to-digital conversion module is switched in the zoom process may also be determined by detecting one or more of the following content: an analog current signal of the first-stage amplifier, an analog current signal of the second-stage amplifier, an analog current signal of the bias tee, and an analog current signal of the ADC.

Figure 11:
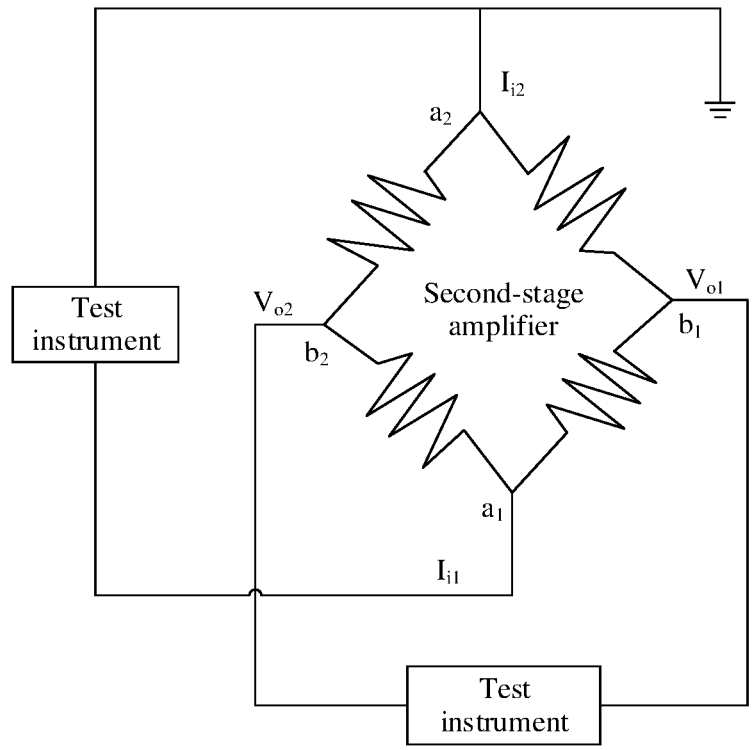
FIG. 11 is an example of a schematic diagram of detecting, by using a second-stage amplifier, whether a configuration parameter of an analog-to-digital conversion module is switched.

FIG. 11 is an example of a schematic diagram of detecting, by using a second-stage amplifier, whether a configuration parameter of an analog-to-digital conversion module is switched.

In one case, a first end of a test instrument may be connected to a first input end $a_1$ of the second-stage amplifier, and a second end of the test instrument may be connected to a second input end $a_2$ of the second-stage amplifier. In this way, in the continuous zoom process, the test instrument obtains, in real time by using the first end, a current $I_{i1}$ input by the first input end $a_1$ of the second-stage amplifier, obtains, in real time by using the second end, a current $I_{i2}$ input by the second input end $a_2$ of the second-stage amplifier, and obtains a real-time current $I_{i1}$-$I_{i2}$ on the second-stage amplifier through calculation based on the current $I_{i1}$ and the current $I_{i2}$. If the current jumps in the continuous zoom process, it is determined that the configuration parameter of the analog-to-digital conversion module is switched.

In another case, a first end of a test instrument may be connected to a first output end $b_1$ of the second-stage amplifier, and a second end of the test instrument may be connected to a second output end $b_2$ of the second-stage amplifier. In this way, in the continuous zoom process, the test instrument obtains, in real time by using the first end, a voltage $V_{o1}$ output by the first output end $b_1$ of the second-stage amplifier, obtains, in real time by using the second end, a voltage $V_{o2}$ output by the second output end $b_2$ of the second-stage amplifier, and obtains a real-time current $V_{o1}$-$V_{o2}$ on the second-stage amplifier through calculation based on the voltage $V_{o1}$ and the voltage $V_{o2}$. If the voltage jumps in the continuous zoom process, it is determined that the configuration parameter of the analog-to-digital conversion module is switched.

For example, in this embodiment, only when the jump of the analog voltage signal or the jump of the analog current signal exceeds noise of the analog-to-digital conversion module, the jump of the analog voltage signal or the jump of the analog current signal can be detected in the foregoing manner. However, when the jump of the analog voltage signal or the jump of the analog current signal does not exceed noise of a Hall effect sensor, the jump of the analog voltage signal or the jump of the analog current signal is considered as noise interference and is compensated for. In this case, the jump of the analog voltage signal or the jump of the analog current signal cannot be detected.

Figure 12:
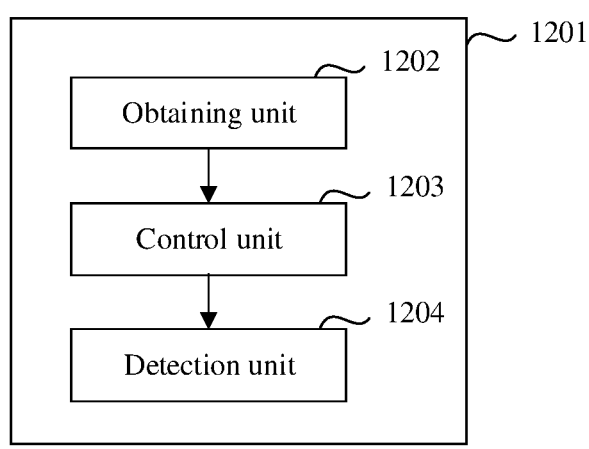
FIG. 12 is an example of a schematic diagram of a structure of a camera module according to an embodiment of the present disclosure.

Based on the foregoing embodiment and a same concept, FIG. 12 is a schematic diagram of a controller according to an embodiment of the present disclosure. As shown in FIG. 12, a controller 1201 may be a chip or a circuit, for example, a chip or a circuit that may be disposed in a camera module.

As shown in FIG. 12, the controller 1201 may include an obtaining unit 1202, a control unit 1203, and a detection unit 1204.

In a possible implementation, the obtaining unit 1202 is configured to obtain a target focal length. The control unit 1203 is configured to control, based on the target focal length, a lens to move in different subregions. An operation region includes N subregions. N is an integer greater than or equal to 2. Each subregion is smaller than the operation region. Each subregion corresponds to a position detection relationship. The position detection relationship is used to define a capability of each digital signal output by a position detection module to represent a movement distance of the lens in the subregion. The detection unit 1204 is configured to: when the lens moves in each subregion, determine position information of the lens based on a position detection relationship of a subregion in which the lens is currently located.

In an optional implementation, the N subregions may include a first subregion and a second subregion. The first subregion and the second subregion are adjacent and have an overlapping region. The control unit 1203 is further configured to: before the lens moves to a preset position in the overlapping region, determine the first subregion as the subregion in which the lens is currently located; and after the lens moves to the preset position in the overlapping region, determine the second subregion as the subregion in which the lens is currently located.

In an optional implementation, the preset position is an end position of the overlapping region, and the lens moves out of the overlapping region at the end position.

In an optional implementation, the control unit 1203 is specifically configured to: determine target position information of the lens based on the target focal length, and when first position information of a current position of the lens does not match the target position information, input a first electrical signal to a drive component based on the first position information and the target position information, so that the drive component drives the lens to move. Correspondingly, the detection unit 1204 is specifically configured to determine, based on a position detection relationship of a subregion in which the lens is located after the lens moves, second position information of the lens after the lens moves. The control unit 1203 is further configured to: when the second position information does not match the target position information, input a second electrical signal to the drive component based on the second position information and the target position information, so that the drive component drives the lens to continue to move, and when the second position information matches the target position information, the drive component stops driving the lens to move.

In an optional implementation, the position detection module may include a Hall effect sensor module and an analog-to-digital conversion module. The position detection relationship of each subregion includes a configuration parameter of the analog-to-digital conversion module corresponding to the subregion, and a correspondence between a digital signal output by the analog-to-digital conversion module corresponding to the subregion and the position information of the lens. In this case, the detection unit 1204 is specifically configured to: first determine, based on position indication information that is of the lens and that is detected by the Hall effect sensor module and a preset correspondence between the position indication information and the subregion, a target subregion in which the lens is located after the lens moves, process the position indication information based on a first configuration parameter of the analog-to-digital conversion module corresponding to the target subregion by using the analog-to-digital conversion module, to output a first digital signal, and determine, based on a correspondence between the digital signal output by the analog-to-digital conversion module corresponding to the target subregion and the position information of the lens, the second position information corresponding to the first digital signal. The position indication information indicates position information after the lens moves.

In an optional implementation, the drive component may include a motor. The Hall effect sensor module may include a Hall magnet and a Hall coil. The Hall magnet is fastened to the lens. The position indication information may be an electrical signal output by the Hall coil. In this case, the control unit 1203 is specifically configured to drive, by using the motor, the lens and the Hall magnet to move. The detection unit 1204 is specifically configured to: when the Hall magnet moves, output a third electrical signal to the analog-to-digital conversion module by using the Hall coil, and determine, based on a preset correspondence between the electrical signal output by the Hall coil and the subregion in which the lens is located, a target subregion corresponding to the third electrical signal.

In a possible implementation, the analog-to-digital conversion module may include a first-stage amplifier, a second-stage amplifier, a bias tee, and an analog-to-digital converter. An input end of the first-stage amplifier is connected to the Hall coil. An output end of the first-stage amplifier is connected to an input end of the second-stage amplifier. An output end of the second-stage amplifier is connected to an input end of the bias tee. An output end of the bias tee is connected to an input end of the analog-to-digital converter. The first configuration parameter includes an amplification coefficient of the first-stage amplifier, an amplification coefficient of the second-stage amplifier, and a bias coefficient of the bias tee. In this case, the detection unit 1204 is specifically configured to process the third electrical signal by using the first-stage amplifier, the second-stage amplifier, and the bias tee, and output the first digital signal by using the analog-to-digital converter.

In an optional implementation, the N subregions may include the first subregion and the second subregion. The first subregion and the second subregion are adjacent and have an overlapping region. The detection unit 1204 is specifically configured to: when the position indication information that is of the lens and that is detected by the Hall effect sensor module matches position indication information corresponding to the first subregion, determine the target subregion as the first subregion, where the position indication information corresponding to the first subregion includes the position indication information that is of the lens and that is detected by the Hall effect sensor module when the lens is located in any position between a first endpoint of the first subregion and a preset position, and the first endpoint is not in the overlapping region; and when the position indication information that is of the lens and that is detected by the Hall effect sensor module matches position indication information corresponding to the second subregion, determine the target subregion as the second subregion, where the position indication information corresponding to the second subregion includes position indication information that is of the lens and that is detected by the Hall effect sensor module when the lens is located at any position between the preset position and a second endpoint of the second subregion, and the second endpoint is not in the overlapping region. The preset position is a position in the overlapping region.

In an optional implementation, the N subregions may include a third subregion and a fourth subregion. The third subregion includes a third endpoint and a fourth endpoint. The fourth subregion includes a fifth endpoint and a sixth endpoint. Before the detection unit 1204 determines the target position information of the lens based on the target focal length, the control unit 1203 is further configured to control the drive component to drive the lens to move between the third subregion and the fourth subregion. The detection unit 1204 is further configured to: when the lens is located at the third endpoint, process a fourth electrical signal by using the analog-to-digital conversion module based on a second configuration parameter, to output a second digital signal, when the lens is located at the fourth endpoint, process a fifth electrical signal by using the analog-to-digital conversion module based on a second configuration parameter, to output a third digital signal, when the lens is located at the fifth endpoint, process a sixth electrical signal by using the analog-to-digital conversion module based on a third configuration parameter, to output a fourth digital signal, and when the lens is located at the sixth endpoint, process a seventh electrical signal by using the analog-to-digital conversion module based on a third configuration parameter, to output a fifth digital signal. A difference between the second digital signal and the third digital signal is a first difference. A difference between the fourth digital signal and the fifth digital signal is a second difference. An absolute value of the first difference and an absolute value of the second difference are not less than a preset digital signal range difference.

In an optional implementation, a correspondence between a digital signal output by the analog-to-digital conversion module corresponding to the third subregion and the position information of the lens includes the following features: The second digital signal corresponds to position information at the third endpoint, and the third digital signal corresponds to position information at the fourth endpoint. Correspondingly, a correspondence between a digital signal output by the analog-to-digital conversion module corresponding to the fourth subregion and the position information of the lens includes the following features: The fourth digital signal corresponds to position information at the fifth endpoint, and the fifth digital signal corresponds to position information at the sixth endpoint.

In an optional implementation, a union set of the N subregions is not smaller than the operation region of the lens.

For a concept, an explanation, a detailed description, and other steps with respect to the controller that are related to the technical solutions provided in this embodiment, refer to descriptions of the content in the foregoing methods or another embodiment. Details are not described herein again.

It may be understood that for a function of each unit in the controller 1201, refer to corresponding method embodiments, and details are not described herein again.

It should be understood that the foregoing unit division of the controller is merely logical function division. During actual implementation, all or some units may be integrated into one physical entity, or may be physically separated.

According to the method provided in embodiments of the present disclosure, the present disclosure further provides a computer program product. The computer program product includes computer program code. When the computer program code is run on a computer, the computer is enabled to perform the method in any one of embodiments shown in FIG. 3A and FIG. 3B to FIG. 11.

According to the method provided in embodiments of the present disclosure, the present disclosure further provides a computer-readable storage medium. The computer-readable medium stores program code. When the program code is run on a computer, the computer is enabled to perform the method in any one of embodiments shown in FIG. 3A and FIG. 3B to FIG. 11.

All or some of the foregoing embodiments may be implemented by using software, hardware, firmware, or any combination thereof. When software is used to implement embodiments, all or a part of embodiments may be implemented in a form of a computer program product. The computer program product includes one or more computer instructions. When the computer program instructions are loaded and executed on a computer, procedures or functions according to embodiments of the present disclosure are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, a solid state drive (SSD)), or the like.

The controller in the foregoing apparatus embodiments corresponds to the controller in the method embodiments. A corresponding module or unit performs a corresponding step. For example, a communication unit (a transceiver) performs a receiving step or a sending step in the method embodiments, and a processing unit (a processor) may perform steps other than the sending step and the receiving step. For a function of a specific unit, refer to a corresponding method embodiment. There may be one or more processors.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As illustrated by using figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and based on, for example, a signal having one or more data packets (for example, data from two components interacting with another component in a local system, a distributed system, and/or across a network such as the Internet interacting with other systems by using the signal).

A person of ordinary skill in the art may be aware that, in combination with illustrative logical blocks (illustrative logical block) described in embodiments disclosed in this specification and steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in the present disclosure, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in an electrical form, a mechanical form, or another form.

The units described as separate parts may or may not be physically separate, and parts displayed as units may or may not be physical units, in other words, may be located in one position, or may be distributed on a plurality of network units. Some or all of the units may be selected based on actual requirements to achieve the objective of the solutions of embodiments.

In addition, functional units in embodiments of the present disclosure may be integrated into one processing unit, each of the units may exist alone physically, or two or more units may be integrated into one unit.

When functions are implemented in the form of a software functional unit and sold or used as an independent product, the functions may be stored in a computer-readable storage medium. Based on such an understanding, the technical solutions of the present disclosure essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of the present disclosure. The foregoing storage medium includes various media that can store program code, such as a USB flash drive, a removable hard disk, a read-only memory (ROM), a random access memory (RAM), a magnetic disk, or an optical disc.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A zoom method, applied to a camera module, wherein the camera module comprises a lens, a driver, a position detector, and a controller, the controller is configured to control the driver to drive the lens to move in an operation region, the operation region comprises N subregions, N is an integer greater than or equal to 2, each of the N subregions is smaller than the operation region, each of the N subregions corresponds to a position detection relationship for defining a capability of each digital signal output by the position detector to represent a movement distance of the lens in the subregion; and the method is executed by the controller and comprises:

obtaining a target focal length; and controlling, based on the target focal length, the lens to move in different subregions, wherein when the lens moves in each of the N subregions, position information of the lens is determined based on a position detection relationship of the subregion in which the lens is currently located, wherein the N subregions comprise a first subregion and a second subregion, and the first subregion and the second subregion are adjacent and have an overlapping region;

when the controller controls the driver to drive the lens to move from the first subregion to the second subregion, before the lens moves to a preset position in the overlapping region, the first subregion is determined as the subregion in which the lens is currently located; and after the lens moves to the preset position in the overlapping region, the second subregion is determined as the subregion in which the lens is currently located.

2. The zoom method according to claim 1, wherein the preset position is an end position of the overlapping region, and the lens moves out of the overlapping region at the end position.

3. The zoom method according to claim 1, wherein the controlling, based on the target focal length, the lens to move in different subregions comprises:

determining target position information of the lens based on the target focal length;

when first position information of a current position of the lens does not match the target position information, inputting a first electrical signal to the driver based on the first position information and the target position information, so that the driver drives the lens to move;

determining, based on a position detection relationship of a subregion in which the lens is located after the lens moves, second position information of the lens after the lens moves;

in response to determination that the second position information does not match the target position information, inputting a second electrical signal to the driver based on the second position information and the target position information, so that the driver drives the lens to continue to move; and in response to determination that the second position information matches the target position information, stopping driving the lens to move.

4. The zoom method according to claim 3, wherein the position detector comprises a Hall effect sensor and an analog-to-digital converter, and the position detection relationship of each of the N subregions comprises a configuration parameter of the analog-to-digital converter corresponding to the subregion, and a correspondence between a digital signal output by the analog-to-digital converter corresponding to the subregion and the position information of the lens; and the determining, based on a position detection relationship of a subregion in which the lens is located after the lens moves, second position information of the lens after the lens moves comprises:

determining, based on position indication information that is of the lens and that is detected by the Hall effect sensor and a preset correspondence between the position indication information and the subregion, a target subregion in which the lens is located after the lens moves, wherein the position indication information indicates position information of the lens after the lens moves;

processing the position indication information based on a first configuration parameter of the analog-to-digital converter corresponding to the target subregion by using the analog-to-digital converter, to output a first digital signal; and determining the second position information corresponding to the first digital signal based on a correspondence between the digital signal output by the analog-to-digital converter corresponding to the target subregion and the position information of the lens.

5. The zoom method according to claim 4, wherein the driver comprises a motor, the Hall effect sensor comprises a Hall magnet and a Hall coil, the Hall magnet is fastened to the lens, and the position indication information is an electrical signal output by the Hall coil;

the driving of the lens to move by the driver comprises:

driving, by using the motor, the lens and the Hall magnet to move; and the determining, based on position indication information that is of the lens and that is detected by the Hall effect sensor and a preset correspondence between the position indication information and the subregion, a target subregion in which the lens is located after the lens moves comprises:

when the Hall magnet moves, outputting a third electrical signal to the analog-to-digital converter by using the Hall coil; and determining the target subregion corresponding to the third electrical signal based on a preset correspondence between an electrical signal output by the Hall coil and a subregion in which the lens is located.

6. The zoom method according to claim 5, wherein the analog-to-digital converter comprises a first-stage amplifier, a second-stage amplifier, a bias tee, and an analog-to-digital converter;

an input end of the first-stage amplifier is connected to the Hall coil, an output end of the first-stage amplifier is connected to an input end of the second-stage amplifier, an output end of the second-stage amplifier is connected to an input end of the bias tee, and an output end of the bias tee is connected to an input end of the analog-to-digital converter;

the first configuration parameter comprises an amplification coefficient of the first-stage amplifier, an amplification coefficient of the second-stage amplifier, and a bias coefficient of the bias tee; and the processing the position indication information based on a first configuration parameter of the analog-to-digital converter corresponding to the target subregion by using the analog-to-digital converter, to output a first digital signal comprises:

processing the third electrical signal by using the first-stage amplifier, the second-stage amplifier, and the bias tee, and outputting the first digital signal by using the analog-to-digital converter.

7. The zoom method according to claim 4, wherein the N subregions comprise a first subregion and a second subregion, and the first subregion and the second subregion are adjacent and have an overlapping region;

the determining, based on position indication information that is of the lens and that is detected by the Hall effect sensor and a preset correspondence between the position indication information and the subregion, a target subregion in which the lens is located after the lens moves comprises:

when the position indication information that is of the lens and that is detected by the Hall effect sensor matches position indication information corresponding to the first subregion, determining the target subregion as the first subregion, wherein the position indication information corresponding to the first subregion comprises position indication information that is of the lens and that is detected by the Hall effect sensor when the lens is located at any position between a first endpoint of the first subregion and a preset position, and the first endpoint is not in the overlapping region; and when the position indication information that is of the lens and that is detected by the Hall effect sensor matches position indication information corresponding to the second subregion, determining the target subregion as the second subregion, wherein the position indication information corresponding to the second subregion comprises position indication information that is of the lens and that is detected by the Hall effect sensor when the lens is located at any position between the preset position and a second endpoint of the second subregion, and the second endpoint is not in the overlapping region; and the preset position is in the overlapping region.

8. The zoom method according to claim 4, wherein the N subregions comprise a third subregion and a fourth subregion, the third subregion comprises a third endpoint and a fourth endpoint, and the fourth subregion comprises a fifth endpoint and a sixth endpoint;

before the determining target position information of the lens based on the target focal length, the method further comprises:

when the lens is located at the third endpoint, processing a fourth electrical signal by using the analog-to-digital converter based on a second configuration parameter, to output a second digital signal;

when the lens is located at the fourth endpoint, processing a fifth electrical signal by using the analog-to-digital converter based on a second configuration parameter, to output a third digital signal;

when the lens is located at the fifth endpoint, processing a sixth electrical signal by using the analog-to-digital converter based on a third configuration parameter, to output a fourth digital signal; or when the lens is located at the sixth endpoint, processing a seventh electrical signal by using the analog-to-digital converter based on a third configuration parameter, to output a fifth digital signal; and an absolute value of a first difference and an absolute value of a second difference are not less than a preset digital signal range difference, the first difference is a difference between the second digital signal and the third digital signal, and the second difference is a difference between the fourth digital signal and the fifth digital signal.

9. The zoom method according to claim 8, wherein a correspondence between a digital signal output by the analog-to-digital converter corresponding to the third subregion and the position information of the lens comprises:

the second digital signal corresponds to position information at the third endpoint; and the third digital signal corresponds to position information at the fourth endpoint; and a correspondence between a digital signal output by the analog-to-digital converter corresponding to the fourth subregion and the position information of the lens comprises:

the fourth digital signal corresponds to position information at the fifth endpoint; and the fifth digital signal corresponds to position information at the sixth endpoint.

10. The zoom method according to claim 1, wherein a union set of the N subregions is equal or larger than the operation region of the lens.

11. An imaging device, comprising a lens, a driver, a position detector, a controller, and a memory, and the controller is separately connected to the driver and the position detector;

the controller is configured to obtain a target focal length, and send control information to the driver based on the target focal length;

the driver is configured to drive, under control of the control information, the lens to move in an operation region, wherein the operation region comprises N subregions, N is an integer greater than or equal to 2, each of the N subregions is smaller than the operation region, each of the N subregions corresponds to a position detection relationship for defining a capability of each digital signal output by the position detector to represent a movement distance of the lens in the subregion; and the controller is further configured to: when the lens moves in each of the N subregions, determine position information of the lens based on a position detection relationship of the subregion in which the lens is currently located, wherein the N subregions comprise a first subregion and a second subregion, and the first subregion and the second subregion are adjacent and have an overlapping region;

the driver is further configured to drive, under control of the control information, to move from the first subregion to the second subregion, and the controller is further configured to: before the lens moves to a preset position in the overlapping region, determine the first subregion as the subregion in which the lens is currently located; and after the lens moves to the preset position in the overlapping region, determine the second subregion as the subregion in which the lens is currently located.

12. The imaging device according to claim 11, wherein the preset position is an end position of the overlapping region, and the lens moves out of the overlapping region at the end position.

13. The imaging device according to claim 11, wherein the controller is further configured to:

determine target position information of the lens based on the target focal length, and when first position information of a current position of the lens does not match the target position information, input a first electrical signal to the driver based on the first position information and the target position information;

the driver is further configured to drive, based on the first electrical signal, the lens to move;

the controller is further configured to: determine, based on a position detection relationship of a subregion in which the lens is located after the lens moves, second position information of the lens after the lens moves; when the second position information does not match the target position information, input a second electrical signal to the driver based on the second position information and the target position information; and when the second position information matches the target position information, send drive stopping information to the driver; and the driver is further configured to: after receiving the second electrical signal, drive, based on the second electrical signal, the lens to continue to move; and after receiving the drive stopping information, stop driving the lens to move.

14. The imaging device according to claim 13, wherein the position detector comprises a Hall effect sensor and an analog-to-digital converter, the controller is separately connected to the Hall effect sensor and the analog-to-digital converter, and the position detection relationship of each of the N subregions comprises a configuration parameter of the analog-to-digital converter corresponding to the subregion, and a correspondence between a digital signal output by the analog-to-digital converter corresponding to the subregion and the position information of the lens;

the controller is further configured to: when the driver drives, based on the first electrical signal, the lens to move, obtain position indication information that is of the lens and that is detected by the Hall effect sensor, determine, based on the position indication information and a preset correspondence between the position indication information and the subregion, a target subregion in which the lens is located after the lens moves, and send, to the analog-to-digital converter, a first configuration parameter of the analog-to-digital converter corresponding to the target subregion, wherein the position indication information indicates position information of the lens after the lens moves;

the analog-to-digital converter is configured to process the position indication information based on the first configuration parameter of the analog-to-digital converter corresponding to the target subregion, to output a first digital signal; and the controller is further configured to obtain the first digital signal, and determine the second position information corresponding to the first digital signal based on a correspondence between the digital signal output by the analog-to-digital converter corresponding to the target subregion and the position information of the lens.

15. The imaging device according to claim 14, wherein the driver comprises a motor, the Hall effect sensor comprises a Hall magnet and a Hall coil, the Hall magnet is fastened to the lens;

the driver is further configured to drive, by using the motor, the lens and the Hall magnet to move;

the Hall coil is configured to: when the Hall magnet moves, output a third electrical signal to the analog-to-digital converter;

the analog-to-digital converter is configured to process the third electrical signal based on the first configuration parameter of the analog-to-digital converter corresponding to the target subregion, to output the first digital signal; and the controller is further configured to obtain the third electrical signal, and determine the target subregion corresponding to the third electrical signal based on a preset correspondence between an electrical signal output by the Hall coil and a subregion in which the lens is located.

16. The imaging device according to claim 15, wherein the analog-to-digital converter comprises a first-stage amplifier, a second-stage amplifier, a bias tee, and an analog-to-digital converter, an input end of the first-stage amplifier is connected to the Hall coil, an output end of the first-stage amplifier is connected to an input end of the second-stage amplifier, an output end of the second-stage amplifier is connected to an input end of the bias tee, and an output end of the bias tee is connected to an input end of the analog-to-digital converter;

the first configuration parameter comprises an amplification coefficient of the first-stage amplifier, an amplification coefficient of the second-stage amplifier, and a bias coefficient of the bias tee; and the analog-to-digital converter is further configured to process the third electrical signal by using the first-stage amplifier, the second-stage amplifier, and the bias tee, and output the first digital signal.

17. The imaging device according to claim 14, wherein the N subregions comprise a first subregion and a second subregion, and the first subregion and the second subregion are adjacent and have an overlapping region;

the controller is further configured to: obtain the position indication information that is of the lens and that is detected by the Hall effect sensor, and when the position indication information matches position indication information corresponding to the first subregion, determine the target subregion as the first subregion, wherein the position indication information corresponding to the first subregion comprises position indication information that is of the lens and that is detected by the Hall effect sensor when the lens is located at any position between a first endpoint of the first subregion and a preset position, and the first endpoint is not in the overlapping region; and when the position indication information matches position indication information corresponding to the second subregion, determine the target subregion as the second subregion, wherein the position indication information corresponding to the second subregion comprises position indication information that is of the lens and that is detected by the Hall effect sensor when the lens is located at any position between the preset position and a second endpoint of the second subregion, and the second endpoint is not in the overlapping region; and the preset position is in the overlapping region.

18. An electronic device, comprising at least one processor and a camera module, wherein the camera module comprises a lens, a driver, a position detector, a controller, and a memory, and the controller is separately connected to the driver and the position detector;

the controller is configured to obtain a target focal length, and send control information to the driver based on the target focal length;

the driver is configured to drive, under control of the control information, the lens to move in an operation region, wherein the operation region comprises N subregions, N is an integer greater than or equal to 2, each of the N subregions is smaller than the operation region, each of the N subregions corresponds to a position detection relationship for defining a capability of each digital signal output by the position detector to represent a movement distance of the lens in the subregion; and the controller is further configured to: when the lens moves in each of the N subregions, determine position information of the lens based on a position detection relationship of the subregion in which the lens is currently located;

the at least one processor is configured to control the camera module, wherein the N subregions comprise a first subregion and a second subregion, and the first subregion and the second subregion are adjacent and have an overlapping region;

the driver is further configured to drive, under control of the control information, to move from the first subregion to the second subregion; and the controller is further configured to: before the lens moves to a preset position in the overlapping region, determine the first subregion as the subregion in which the lens is currently located; and after the lens moves to the preset position in the overlapping region, determine the second subregion as the subregion in which the lens is currently located.

* * * * *